(12) United States Patent
Shim et al.

(10) Patent No.: US 8,603,906 B2
(45) Date of Patent: Dec. 10, 2013

(54) METHOD OF FORMING A THREE-DIMENSIONAL SEMICONDUCTOR MEMORY DEVICE COMPRISING SUB-CELLS, TERRACED STRUCTURES AND STRAPPING REGIONS

(71) Applicants: Sunil Shim, Seoul (KR); Sunghoi Hur, Seoul (KR); Hansoo Kim, Suwon-si (KR); Jaehoon Jang, Seongnam-si (KR); Hoosung Cho, Yongin-si (KR)

(72) Inventors: Sunil Shim, Seoul (KR); Sunghoi Hur, Seoul (KR); Hansoo Kim, Suwon-si (KR); Jaehoon Jang, Seongnam-si (KR); Hoosung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/779,334

(22) Filed: Feb. 27, 2013

(65) Prior Publication Data

US 2013/0171806 A1 Jul. 4, 2013

Related U.S. Application Data

(63) Continuation of application No. 12/943,126, filed on Nov. 10, 2010, now Pat. No. 8,395,190.

(30) Foreign Application Priority Data

Nov. 17, 2009 (KR) ........................ 10-2009-0110975

(51) Int. Cl.
*H01L 21/3205* (2006.01)
*H01L 21/4763* (2006.01)

(52) U.S. Cl.
USPC ........... 438/588; 438/279; 438/591; 438/268; 438/156; 257/208; 257/329; 257/776; 257/324; 257/E27.096; 365/185

(58) Field of Classification Search
None
See application file for complete search history.

(56) References Cited

U.S. PATENT DOCUMENTS

| 3,724,065 A | 4/1973 | Carbajal et al. |
| 5,403,435 A | 4/1995 | Cathey et al. |

(Continued)

FOREIGN PATENT DOCUMENTS

| JP | 2006-338602 | 12/1994 |
| JP | 10-093038 | 4/1998 |

(Continued)

OTHER PUBLICATIONS

Fukuzumi et al., "Optimal Integration and Characteristics of Vertical Array Devices for Ultra-High Density, Bit-Cost Scalable Flash Memory," 2007 IEEE, pp. 449-452.

(Continued)

*Primary Examiner* — Marcos D. Pizarro
*Assistant Examiner* — Cesar Lopez
(74) *Attorney, Agent, or Firm* — Myers Bigel Sibley & Sajovec, P.A.

(57) ABSTRACT

Provided is a three-dimensional semiconductor memory device. The three-dimensional semiconductor memory device includes a substrate that has a cell array region including a pair of sub-cell regions and a strapping region interposed between the pair of sub-cell regions. A Plurality of sub-gates are sequentially stacked on the substrate in each of the sub-cell regions, and interconnections are electrically connected to extensions of the stacked sub-gates, respectively, which extend into the strapping region. Each of the interconnections is electrically connected to the extensions of the sub-gate which are disposed in the pair of the sub-cell regions, respectively, and which are located at the same level.

12 Claims, 34 Drawing Sheets

(56) References Cited

U.S. PATENT DOCUMENTS

| | | | |
|---|---|---|---|
| 5,946,230 A | 8/1999 | Shimizo et al. | |
| 6,274,413 B1 | 8/2001 | Fang et al. | |
| 6,483,749 B1 | 11/2002 | Choi et al. | |
| 6,870,216 B2 | 3/2005 | Hsiao et al. | |
| 6,933,556 B2 | 8/2005 | Endoh et al. | |
| 7,382,018 B2 | 6/2008 | Kim et al. | |
| 7,539,056 B2 | 5/2009 | Katsumata et al. | |
| 7,884,417 B2 * | 2/2011 | Mizukami et al. | 257/324 |
| 8,008,722 B2 | 8/2011 | Kim et al. | |
| 8,102,711 B2 | 1/2012 | Maejima | |
| 8,193,054 B2 | 6/2012 | Alsmeier | |
| 8,247,857 B2 | 8/2012 | Ozawa et al. | |
| 8,278,170 B2 | 10/2012 | Lee et al. | |
| 2006/0125029 A1 | 6/2006 | Kanda | |
| 2007/0158736 A1 | 7/2007 | Arai et al. | |
| 2007/0173000 A1 | 7/2007 | Yamazaki | |
| 2007/0252201 A1 | 11/2007 | Kito et al. | |
| 2008/0067583 A1 | 3/2008 | Kidoh et al. | |
| 2009/0020744 A1 | 1/2009 | Mizukami et al. | |
| 2009/0212351 A1 | 8/2009 | Chen | |
| 2009/0242968 A1 | 10/2009 | Maeda et al. | |
| 2009/0267135 A1 | 10/2009 | Tanaka et al. | |
| 2009/0268524 A1 | 10/2009 | Maejima | |
| 2010/0109065 A1 | 5/2010 | Oh et al. | |
| 2010/0120214 A1 | 5/2010 | Park et al. | |
| 2010/0133599 A1 | 6/2010 | Chae et al. | |
| 2010/0155810 A1 | 6/2010 | Kim et al. | |
| 2010/0155818 A1 | 6/2010 | Cho et al. | |
| 2010/0163968 A1 | 7/2010 | Kim et al. | |
| 2010/0178755 A1 | 7/2010 | Lee et al. | |
| 2010/0181610 A1 | 7/2010 | Kim et al. | |
| 2010/0195395 A1 | 8/2010 | Jeong et al. | |
| 2010/0213527 A1 | 8/2010 | Shim et al. | |
| 2010/0213537 A1 | 8/2010 | Fukuzumi et al. | |
| 2010/0240205 A1 | 9/2010 | Son et al. | |
| 2010/0246257 A1 | 9/2010 | Ito et al. | |
| 2011/0065270 A1 | 3/2011 | Shim et al. | |
| 2011/0076819 A1 | 3/2011 | Kim et al. | |
| 2011/0147824 A1 | 6/2011 | Son et al. | |
| 2011/0156132 A1 | 6/2011 | Kiyotoshi | |
| 2011/0291178 A1 | 12/2011 | Sasaki et al. | |
| 2011/0316069 A1 | 12/2011 | Tanaka et al. | |
| 2012/0001250 A1 | 1/2012 | Alsmeier | |
| 2012/0039130 A1 | 2/2012 | Yoon et al. | |
| 2012/0049148 A1 | 3/2012 | Fukano | |
| 2012/0068255 A1 | 3/2012 | Lee et al. | |
| 2012/0267699 A1 | 10/2012 | Kiyotoshi | |
| 2012/0327715 A1 | 12/2012 | Lee et al. | |

FOREIGN PATENT DOCUMENTS

| | | |
|---|---|---|
| JP | 2008-072051 | 3/2008 |
| JP | 2008-192708 | 8/2008 |
| JP | 2009-016400 | 1/2009 |
| KR | 1020060089547 A | 8/2006 |
| KR | 100707217 B1 | 4/2007 |
| KR | 1020070113535 A | 11/2007 |
| KR | 1020080070583 A | 7/2008 |
| KR | 1020090047614 A | 5/2009 |

OTHER PUBLICATIONS

Kim et al., "Future memory technology: challenges and opportunities," Symposium on VLSI-TSA Tech, 2008 IEEE, pp. 5-9.

Kim et al., "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, pp. 186-187.

Tanaka et al., "Bit Cost Scalable Technology with Punch and Plug Process for Ultra High Density Flash Memory," 2007 Symposium on VLSI Technology Digest of Technical Papers, pp. 14-15.

Program from the 6$^{th}$ Semiconductor Memory Symposium, Feb. 25, 2008, 11:10-12:00pm, "Multi-Cell NAND-Based SSD Technology and its Trend," Toshiba Semiconductor Company, Memory Business Department, Assistant to Department Manager Shinji Saito, 8 pages.

Koga et al., "Influences of Buried-Oxide Interface on Inversion-Layer Mobility in Ultra-Thin SOI MOSFETs," IEEE Transactions on Electron Devices, vol. 49, No. 6, Jun. 2002, pp. 1042-1048.

* cited by examiner

METHOD OF FORMING A THREE-DIMENSIONAL SEMICONDUCTOR MEMORY DEVICE COMPRISING SUB-CELLS, TERRACED STRUCTURES AND STRAPPING REGIONS

REFERENCE TO RELATED APPLICATIONS

This application is a continuation of U.S. patent application Ser. No. 12/943,126, filed on Nov. 10, 2010, now U.S. Pat. No. 8,395,190, which claims priority to Korean Patent Application 10-2009-0110975, filed Nov. 17, 2009, the contents of which are hereby incorporated herein by reference.

FIELD

The invention relates to semiconductor devices and, more particularly, to three-dimensional semiconductor memory devices.

BACKGROUND

With the high advance of electronic industries, the integration degrees of semiconductor memory devices are increasingly required. The integration degree is a significant factor in the determination of product prices. For example, as the integration degree increases, the price of the semiconductor memory devices may be reduced. For this reason, higher integration degree may be especially required for the semiconductor devices. Generally, since the integration degree of the semiconductor devices may be determined by a two dimensional area of a unit memory cell, the integration degree may be considerably affected by the level of technique for forming fine patterns. However, there may be a limit to fining the patterns due to high expensive equipments and/or difficulties in semiconductor fabricating processes.

Recently, the semiconductor memory devices with a three-dimensional structure are suggested in order to overcome these limitations. These new structures, however, may bring about various problems such as deterioration in reliability and/or operational speed of products. Therefore, much research has actively been undertaken in order to overcome these problems.

SUMMARY

The present disclosure is to provide a three-dimensional semiconductor memory device having good reliability.

The present disclosure is also to provide to a three-dimensional semiconductor memory device capable of operating at high speed.

Embodiments of the inventive concept may provide a three-dimensional semiconductor memory device including: a substrate comprising a cell array region including a pair of sub-cell regions and a strapping region interposed between the pair of sub-cell regions; a plurality of sub-gates sequentially stacked on the substrate in each of the sub-cell regions, each of the sub-gates including an extension extending laterally into the strapping region; a vertical-type channel pattern successively penetrating the stacked sub-gates within each of the sub-cell regions; and interconnections electrically connected to the extensions of the stacked sub-gates, respectively. Each of the interconnections may electrically be connected to the extensions of sub-gates which are disposed in the pair of the sub-cell regions, respectively, and are located at the same level.

In some embodiments, the extensions of the stacked sub-gates may be in a shape of a terraced structure.

In other embodiments, the device may further include: a data storage layer interposed between the vertical-type channel pattern and the sub-gates; and a bitline electrically connected to a top end of the vertical-type channel pattern. In this case, the interconnection may extend into the sub-cell region and cross over the bitline.

In still other embodiments, the device may further include: a conductive line electrically connected to a part of a top surface of the substrate and extending in a direction perpendicular to a longitudinal direction of the interconnections. In this case, the interconnections may be disposed in the strapping region.

Some embodiments of the inventive concept may provide a three-dimensional semiconductor memory device including: a substrate comprising a cell array region including a first sub-cell region, a second sub-cell region, and a strapping region interposed between the first and second sub-cell regions; a plurality of first sub-gates being sequentially stacked on the substrate of the first sub-cell region, each of the first sub-gates including an extension extending laterally into the strapping region; a plurality of second sub-gates being sequentially stacked on the substrate of the second sub-cell region, each of the second sub-gates including an extension extending laterally into the strapping region; a first vertical-type channel pattern penetrating the stacked first sub-gates within the first sub-cell regions and a second vertical-type channel pattern penetrating the stacked second sub-gates within the second sub-cell regions; a first bitline and a second bitline electrically connected to top ends of the first and second vertical-type channel patterns, respectively, the first and second bitlines being parallel to each other; and a plurality of strapping lines crossing over the first and second bitlines. Each of the strapping lines may electrically be connected to the extension of the first sub-gate and the extension of the second sub-gate which are located at the same level.

Other embodiments of the inventive concept may provide a three-dimensional semiconductor memory device including: a substrate comprising a cell array region including a first sub-cell region, a second sub-cell region, and a first strapping region interposed between the first and second sub-cell regions; a plurality of first sub-gates being sequentially stacked on the substrate of the first sub-cell region, each of the first sub-gates including an extension extending laterally into the first strapping region; a plurality of second sub-gates being sequentially stacked on the substrate of the second sub-cell region, each of the second sub-gates including an extension extending laterally into the first strapping region; a first vertical-type channel pattern penetrating the stacked first sub-gates within the first sub-cell regions and a second vertical-type channel pattern penetrating the stacked second sub-gates within the second sub-cell regions; a first conductive line disposed in the first strapping region and electrically connected to a part of a top surface of the substrate within the first strapping region; and a plurality of first interconnections disposed in the first strapping region and extending in parallel with each other in a direction perpendicular to a longitudinal direction of the first conductive line. Each of the first interconnections may electrically be connected to the extension of the first sub-gates and the extension of the second sub-gate which are located at the same level.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
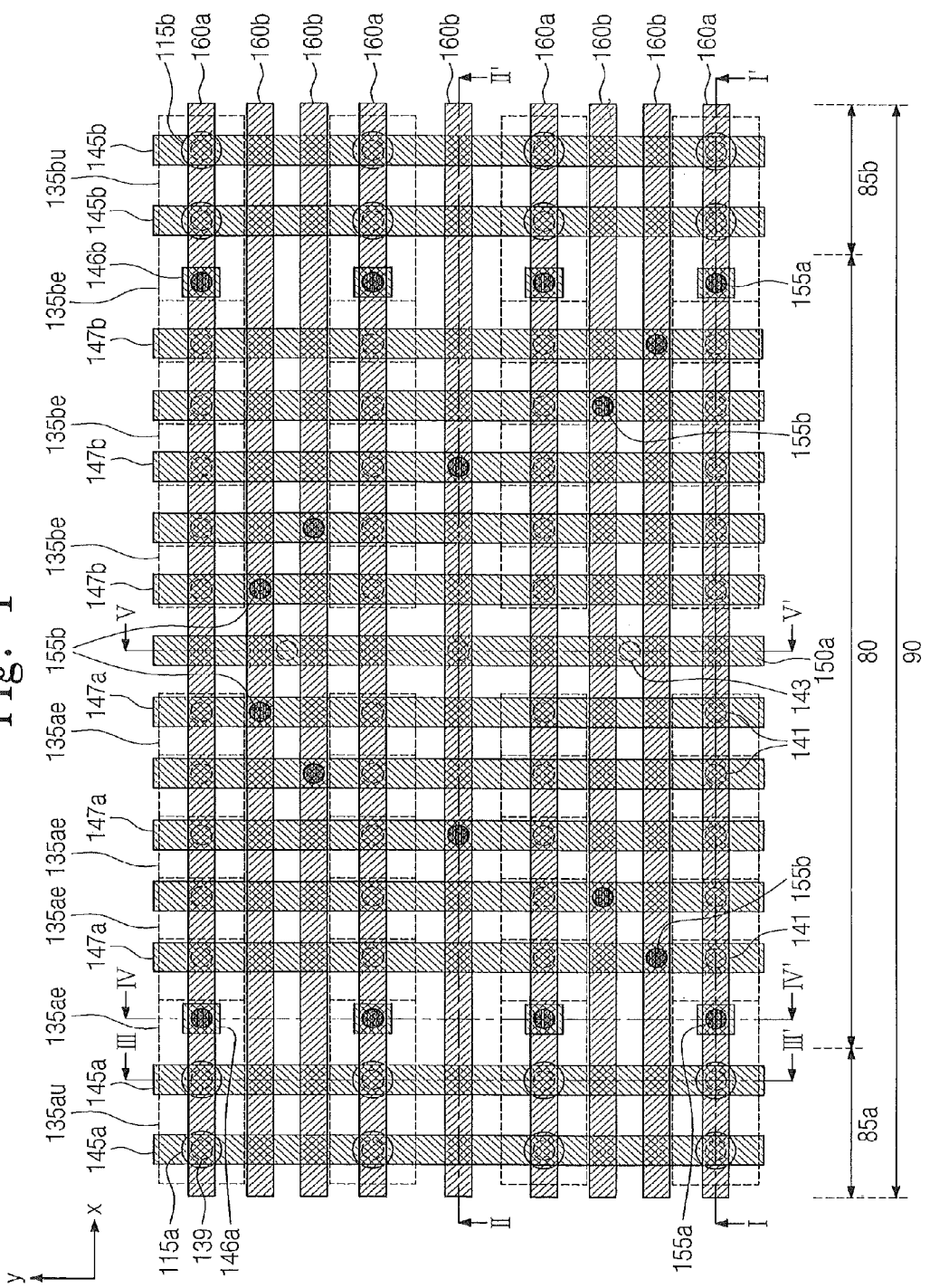
FIG. 1 is a plan view illustrating a three-dimensional semiconductor memory device according to a first embodiment of the inventive concept.

Preferred embodiments of the inventive concept will be described below in more detail with reference to the accompanying drawings. Advantages and features of the inventive concept may be understood more readily by reference to the following detailed description of preferred embodiments and the accompanying drawings. The exemplary embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims.

It will be understood that when any layers are referred to as being "on" another layers or substrate, it may be directly on another layers or substrate or intervening elements or layers may be present. Moreover, it will be understood that, although the terms first, second, third, etc. are used herein to describe various regions, layers, these regions and films should not be limited by these terms. These terms are used to distinguish one predetermined region or layer from another region or layer. Accordingly, a first layer used in the first embodiment of the inventive concept may be used to as a second layer in another embodiment of the inventive concept. As used herein, the term "and/or" includes any and all combinations of one or more of the associated listed items. Throughout the specification, the same reference numerals can be denoted to the same components.

First Embodiment

FIG. 1 is a plan view illustrating a three-dimensional semiconductor memory device according to a first embodiment of the inventive concept; FIGS. 2A, 2B, 2C, 2D, 2E are sectional views taken along the line I-I', II-II', III-III', IV-IV', V-V' of FIG. 1, respectively; and FIG. 3 is a perspective view illustrating the three-dimensional semiconductor memory device according to the first embodiment of the inventive concept.

Referring to FIGS. 1, 2A through 2E, and 3, a substrate 100 may have a cell array region 90 that is provided with three-dimensional memory cells. The substrate 100 may be formed of semiconductor materials. For instance, the substrate 100 may be a silicon-germanium substrate or a germanium substrate. The cell array region 90 may include a plurality of sub-cell regions 85a and 85b and at least one strapping region 80 interposed between the sub-cell regions 85a and 85b. For instance, the cell array region 90 may include a first sub-cell region 85a, a second sub-cell region 85b, and a strapping region 80 interposed between the first and second sub-cell regions 85a and 85b. The first sub-cell region 85a, the strapping region 80, and the second sub-cell region 85b may sequentially be arranged along a first direction parallel to a top surface of the substrate 100. The first direction may be an x-axis illustrated in drawings.

A well region 102 may be formed in the substrate 100 of the cell array region 90. The well region 102 is doped with a first-type dopant. The well region 102 may be formed on an entire surface of the cell array region 90 in plan view. That is, the well region 102 may be formed in the substrate 100 of the first sub-cell region 85a, the strapping region 80, and the second sub-cell region 85b. The upper surface of the well region 102 may be the same level as the top surface of the substrate 100 of the cell array region 90.

A plurality of first sub-gates 135a and 135au may be sequentially stacked on the substrate 100 of the first sub-cell region 85a. The stacked first sub-gates 135a and 135au are vertically spaced apart from each other. Each of the stacked first sub-gates 135a and 135au is an extension 135ae extending laterally into the strapping region 80. A plurality of second sub-gates 135b and 135bu may be sequentially stacked on the substrate 100 of the second sub-cell region 85b. The stacked second sub-gates 135b and 135bu are vertically spaced apart from each other. Each of the stacked second sub-gates 135b and 135bu is an extension 135be extending laterally into the strapping region 80. The extensions 135be of the stacked second sub-gates 135b and 135bu may laterally be spaced apart from the extensions 135ae of the stacked first sub-gates 135a and 135au.

The first and second sub-gates 135a, 135au, 135b, and 135bu may be formed of conductive materials. For instance, the first and second sub-gates 135a, 135au, 135b, and 135bu may include at least one selected from a doped semiconductor, metal (ex., tungsten, titanium, or tantalum), conductive metal nitride (ex., titanium nitride or tantalum nitride), and/or metal-semiconductor compound (ex., titanium silicide, tungsten silicide, or nickel silicide). The first and second sub-gates 135a, 135au, 135b, and 135bu may contain the same conductive material.

Dielectric patterns 108a may be interposed between the stacked first sub-gates 135a and 135au and between the stacked second sub-gates 135b and 135bu. For this reason, the stacked first sub-gates 135a and 135au may vertically be spaced apart from each other, and the stacked second sub-gates 135b and 135bu may vertically be spaced apart from each other. One of the dielectric patterns 108a may be disposed on an uppermost first sub-gate 135au of the stacked first sub-gates 135a and 135au, and another of the dielectric patterns 108a may be disposed on an uppermost second sub-gate 135bu of the stacked second sub-gates 135b and 135bu. In plan view, each of the dielectric patterns 108a may have the same shape as the first sub-gate 135a or 135au or the second sub-gate 135b or 135bu, which is located directly below each of dielectric pattern 108a. Accordingly, each of the dielectric patterns 108a may have an extension extending into the strapping region 80. The extension of each of dielectric pattern 108a may cover the extension 135ae or 135be of the sub-gate 135a, 135au, 135b, or 135bu located directly below each of dielectric pattern 108a.

A buffer dielectric layer 104 may be interposed between the substrate 100 and the lowermost first sub-gate of the first sub-gates 135a and 135au and between the substrate 100 and the lowermost second sub-gate of the second sub-gates 135b and 135bu. The buffer dielectric layer 104 may be thinner than the dielectric patterns 108a. The buffer dielectric layer 104 may be omitted in the first embodiment of the inventive concept.

A first vertical-type channel pattern 115a is disposed in the first sub-cell region 85a. The first vertical-type channel pattern 115a may come in contact with the substrate 100 of the first sub-cell region 85a by penetrating successively the stacked first sub-gates 135a and 135au, the dielectric patterns 108a, and the buffer dielectric layer 104. The first vertical-type channel pattern 115a may come in contact with the well region 102. The first vertical-type channel pattern 115a may have a hollow pipe shape extending upwardly from the top surface of the substrate 100. In this case, the inside of the first vertical-type channel pattern 115a may be filled with a filling dielectric pattern 117. The upper end of the first vertical-type channel pattern 115a having the pipe shape may be a closed state by a capping semiconductor pattern 122. The first vertical-type channel pattern 115a may be formed of semiconductor materials. The first vertical-type channel pattern 115a may contain the same semiconductor materials as the substrate 100. For instance, the first vertical-type channel pattern 115a may be formed of silicon, silicon-germanium, or germanium. The first vertical-type channel pattern 115a may be in an undoped state or may be doped with the first-type dopant. The first vertical-type channel pattern 115a may be in a mono-crystalline state or poly-crystalline state. The capping semiconductor pattern 122 may be formed of the same semiconductor materials as the first vertical-type channel pattern 115a. A drain region 120 may be formed in an upper portion of the first vertical-type channel pattern 115a. The drain region 120 is doped with a second-type dopant. The lower surface of the drain region 120 may be higher than the upper surface of the uppermost first sub-gate 135au. Preferably, the capping semiconductor pattern 122 is also doped with the same dopant as the drain region 120.

According to the first embodiment of the inventive concept, the first vertical-type channel pattern 115a may have a pillar shape. In this case, the filling dielectric pattern 117 and the capping semiconductor pattern 122 may be omitted.

A second vertical-type channel pattern 115b is disposed in the second sub-cell region 85b. The second vertical-type channel pattern 115b may come in contact with the substrate 100 of the second sub-cell region 85b by penetrating successively the stacked second sub-gates 135b and 135bu, the dielectric patterns 108a, and the buffer dielectric layer 104. The second vertical-type channel pattern 115b may also come in contact with the well region 102. The second vertical-type channel pattern 115b has the same shape as the first vertical-type channel pattern 115a, and the second vertical-type channel pattern 115b is formed of the same materials as the first vertical-type channel pattern 115a. When the first and second vertical-type channel patterns 115a and 115b have the hollow pipe shape, the capping semiconductor pattern 122 may be also disposed on the second vertical-type channel pattern 115b. A drain region 120 may be also formed at an upper portion of the second vertical-type channel pattern 115b. The lower surface of the drain region 120 in the second vertical-type channel pattern 115b may be higher than the upper surface of the uppermost second sub-gate 135bu.

A data storage layer 132 is interposed between the stacked first sub-gates 135a and 135au and the first vertical-type channel pattern 115a, and between the stacked second sub-gates 135b and 135bu and the second vertical-type channel pattern 115b. The data storage layer 132 may include a tunnel dielectric layer, a charge storage layer, and a blocking dielectric layer. The charge storage layer may be interposed between the tunnel dielectric layer and the blocking dielectric layer. The charge storage layer may include a dielectric layer having deep-level traps that can store charges. For instance, the charge storage layer may include a nitride layer and/or a metal oxide layer (ex., aluminum oxide layer and/or hafnium oxide layer). The tunnel dielectric layer is interposed between a sidewall of each of the vertical-type channel patterns 115a and 115b and the charge storage layer. The tunnel dielectric layer may include a thermal oxide layer. The tunnel dielectric layer may be a single layer or multiple layers. The blocking dielectric layer is interposed between the charge storage layer and each of the sub-gates 135a, 135au, 135b, and 135bu. The blocking dielectric layer may be a single layer or multiple layers. For instance, the blocking dielectric layer may include at least one selected from a silicon oxide layer and a high-k dielectric layer (ex., metal oxide layer such as an aluminum oxide layer and/or a hafnium oxide layer) having a high dielectric constant compared to the blocking dielectric layer. The data storage layer 132 may extend to be interposed between the dielectric pattern 108a and each of the sub-gates 135a, 135au, 135b, and 135bu. In addition, the data storage layer 132 may extend to be interposed between the lowermost first sub-gate and the substrate 100 and between the lowermost second sub-gate and the substrate 100. Furthermore, the data storage layer 132 may extend to be disposed on each of the upper surfaces of the dielectric patterns 108a on the uppermost sub-gates 135au and 135bu.

The lowermost first sub-gate and the lowermost second sub-gate may be gates of ground selection transistors. In this case, the data storage layer 132, which are interposed between the lowermost first and second sub-gates and the first and second vertical-type channel patterns 115a and 115b, respectively, may be first gate dielectric layers of the ground selection transistors. The data storage layer 132 or the data storage layer 132/the buffer dielectric layer 104, which is interposed between the substrate 100 and the lowermost first and second sub-gates, may be second gate dielectric layers of the ground selection transistors. The uppermost first sub-gate 135au and the uppermost second sub-gate 135bu may be gates of string selection transistors. In this case, the data storage layer 132, which is interposed between the uppermost first and second sub-gates 135au and 135bu and the first and second vertical-type channel patterns 115a and 115b may be gate dielectric layers of the string selection transistors. The first sub-gates between the lowermost first sub-gate and the uppermost first sub-gate 135au may be gates of the cell transistors, and the second sub-gates between the lowermost second sub-gate and the uppermost second sub-gate 135bu may also be gates of the cell transistors.

As illustrated in FIGS. 1 and 3, the stacked first sub-gates 135a and 135au may have a line shape extending along the first direction. The stacked first sub-gates 135a and 135au are defined as a first sub-gate stack. A plurality of the first vertical-type channel patterns 115a may penetrate the first sub-gate stack. The plurality of the first vertical-type channel patterns 115a, which penetrates the first sub-gate stack, may be arranged along the first direction and spaced apart from each other. Similarly, the stacked second sub-gates 135b and 135bu may have a line shape extending along the first direction. The stacked second sub-gates 135b and 135bu are defined as a second sub-gate stack. A plurality of the second vertical-type channel pattern 115a may penetrate the second sub-gate stack. The plurality of the second vertical-type channel patterns 115b, which penetrates the second sub-gate stack, may be arranged along the first direction and spaced apart from each other. The first and second sub-gate stacks may be arranged in the first direction to form one row. Hence, the first and second vertical-type channel patterns 115a and 115b, which penetrate the first and second sub-gate stacks, may also be arranged in the first direction to form one row.

The first sub-gate stack (that is, the stacked first sub-gates 135a and 135au), the second sub-gate stack (that is, the stacked second sub-gates 135b and 135bu), the first vertical-channel patterns 115a, and the second vertical-type channel patterns 115b in one row may be included in a vertical-type string group. As illustrated in FIGS. 1 and 3, a plurality of the vertical-type string groups is arranged in parallel with each other to extend in the first direction. The plurality of the vertical-type string groups may be spaced apart from each other in a second direction perpendicular to the first direction. The second direction is parallel to the top surface of the substrate 100. The second direction may be y-axis illustrated in FIGS. 1 and 3. Consequently, the first vertical-type channel patterns 115a in the first sub-cell region 85a may be two-dimensionally arranged along rows and columns in plan view, and the second vertical-type channel patterns 115b in the second sub-cell region 85b may be two-dimensionally arranged along rows and columns in plan view.

Figure 2A:
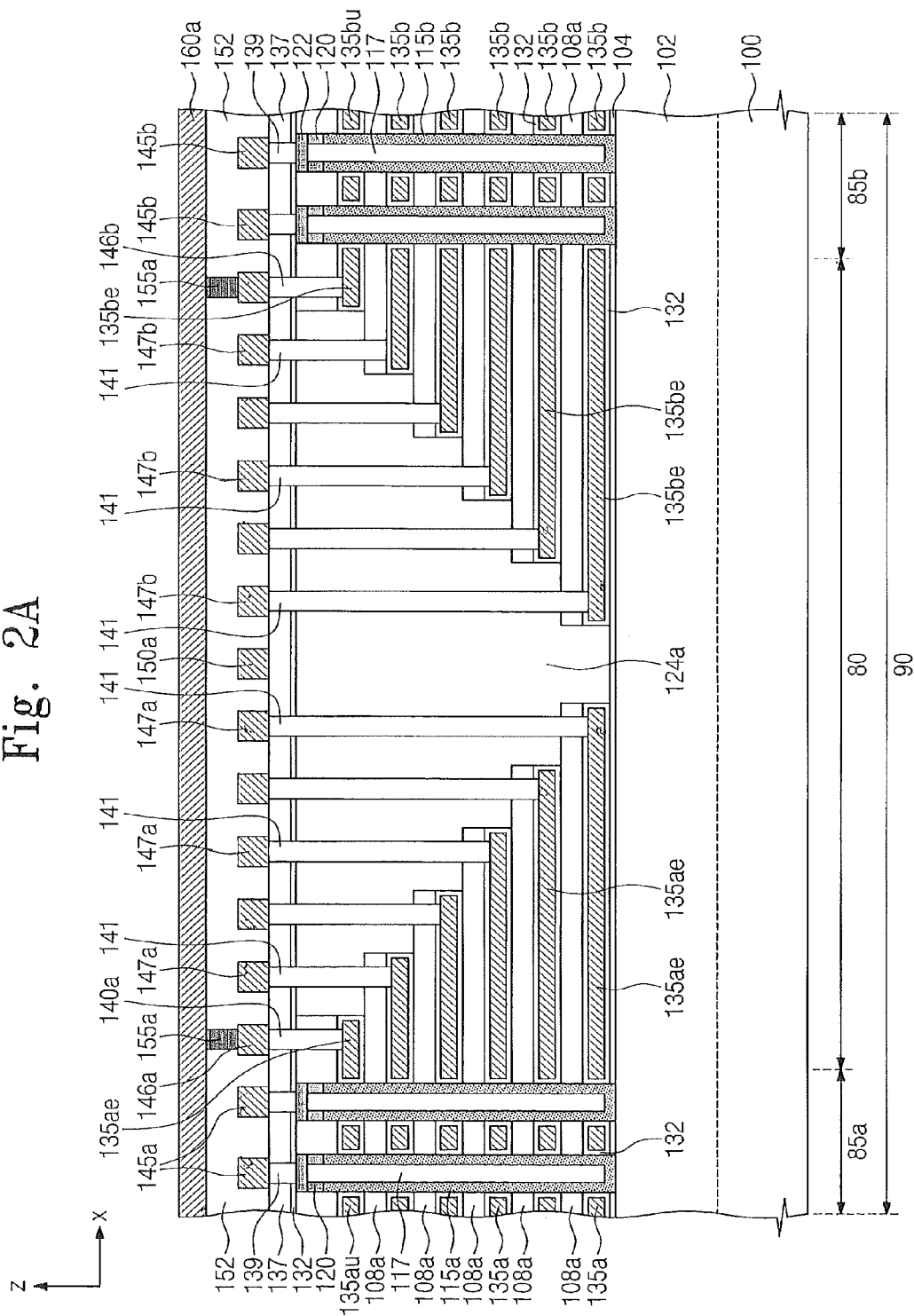
FIG. 2A is a sectional view taken along the line I-I' of FIG. 1.
Figure 2B:
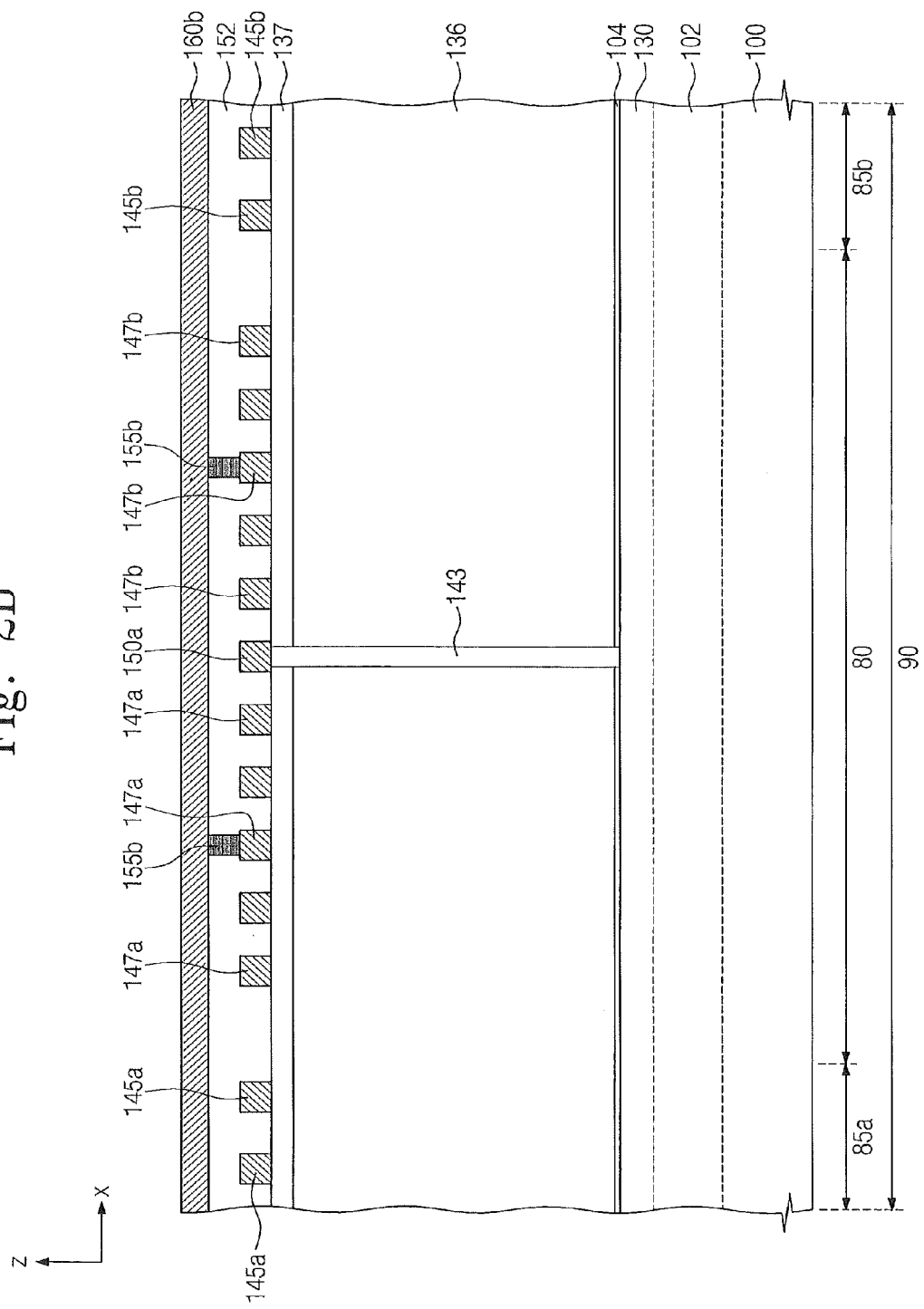
FIG. 2B is a sectional view taken along the line II-II' of FIG. 1.
Figure 3:
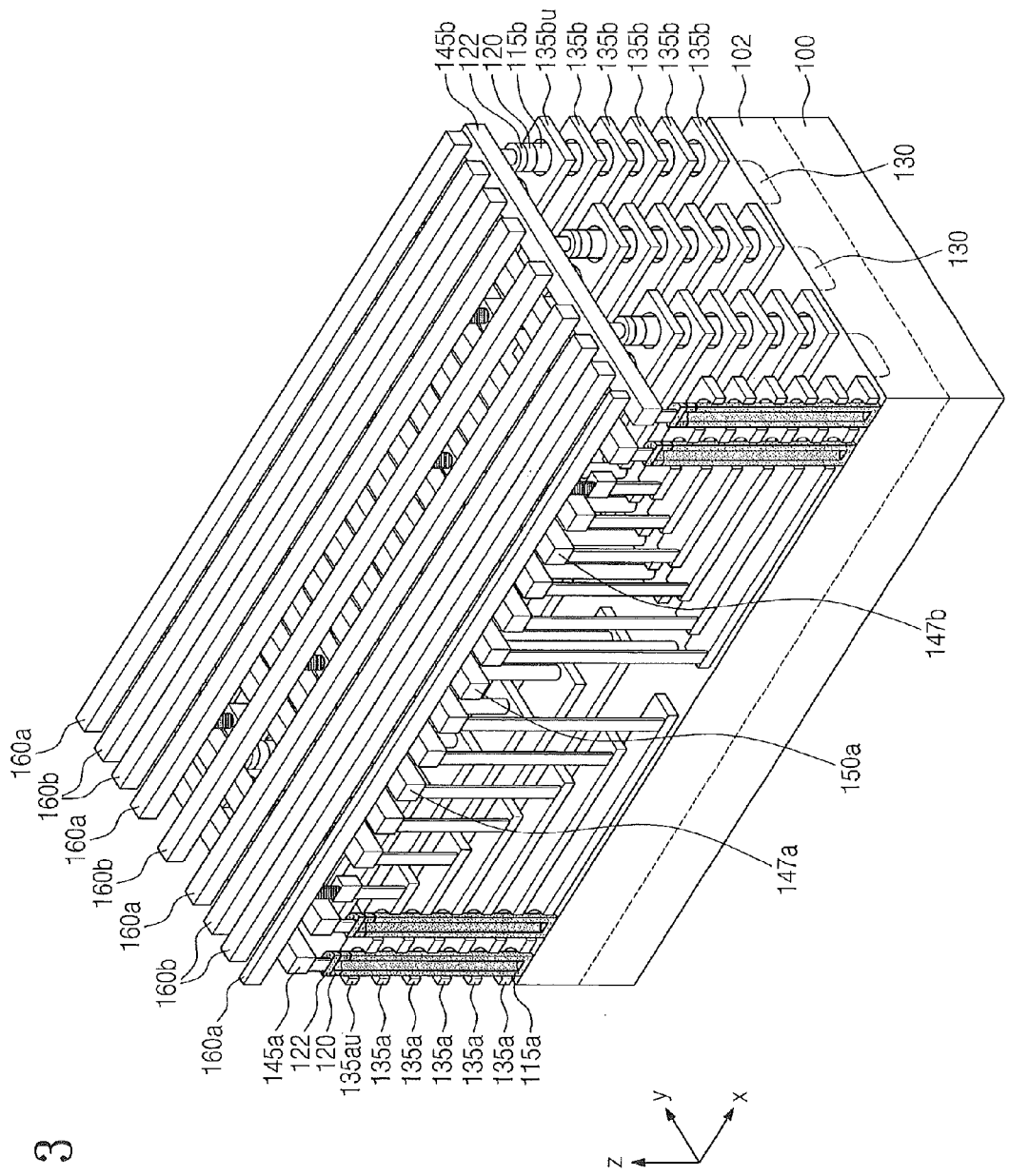
FIG. 3 is a perspective view illustrating the three-dimensional semiconductor memory device according to the first embodiment of the inventive concept.

As illustrated in FIGS. 1, 2A, and 3, the extensions 135ae of the stacked first sub-gates 135a and 135au in each of the vertical-type string groups may be embodied as a terraced structure in the strapping region 80. For instance, among the extensions 135ae of the stacked first sub-gates 135a and 135au, a relatively low extension 135ae may have a long length in the first direction compared to a relatively high extension 135ae. In other words, the relatively low extension 135ae may include a portion which is not overlapped with the relatively high extension 135ae.

The extensions 135be of the stacked second sub-gates 135b and 135bu in each of the vertical-type string groups may also be embodied as a terraced structure in the strapping region 80. For instance, among the extensions 135be of the stacked second sub-gates 135b and 135bu, a relatively low extension 135be may have a long length in the first direction compared to a relatively high extension 135be. In other words, the relatively low extension 135be may include a portion which is not overlapped with the relatively high extension 135be.

In the strapping region 80, the extensions 135ae of the stacked first sub-gates 135a and 135au may be a terraced structure downward in the first direction, and the extensions 135be of the stacked second sub-gates 135b and 135bu may be a terraced structure upward in the first direction. In each of the vertical-type string groups, as illustrated in FIG. 2A, the extensions 135ae of the stacked first sub-gates 135a and 135au may be symmetrical to the extensions 135be of the stacked sub-gates 135b and 135bu with respect to the center of the strapping region 80.

Figure 2C:
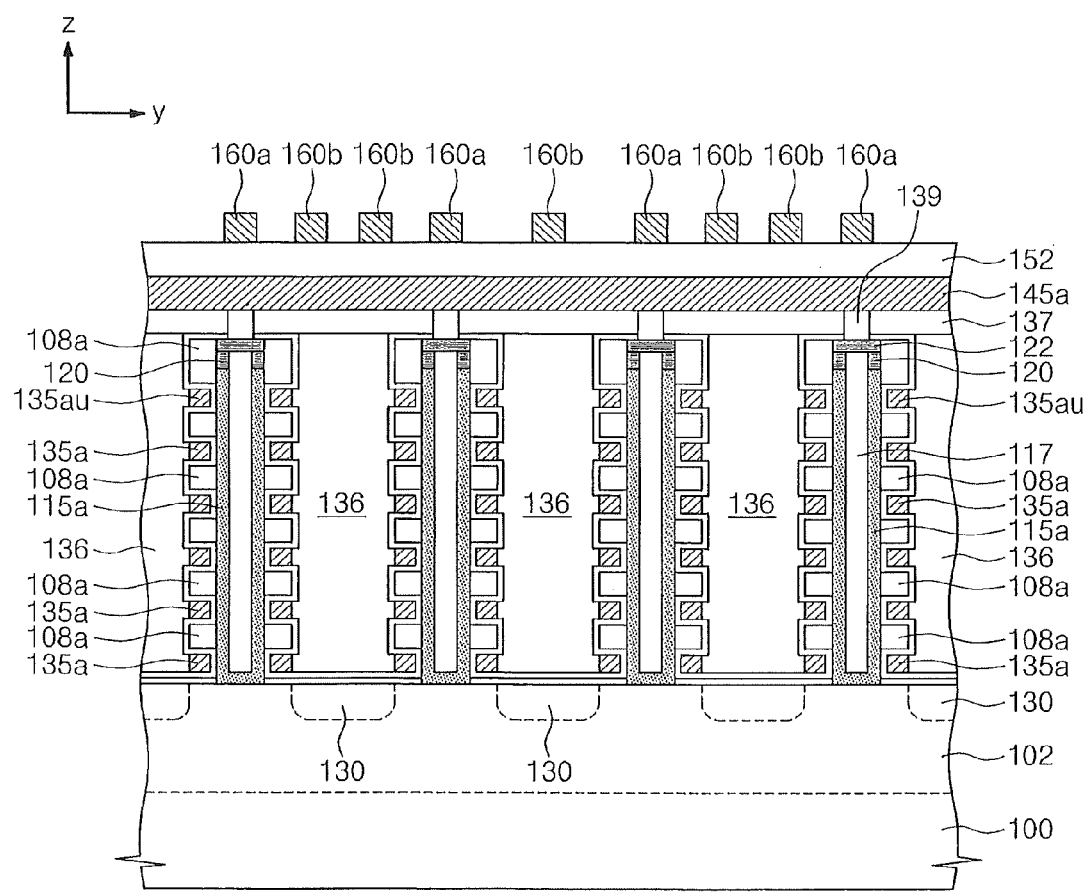
FIG. 2C is a sectional view taken along the line III-III' of FIG. 1.
Figure 2D:
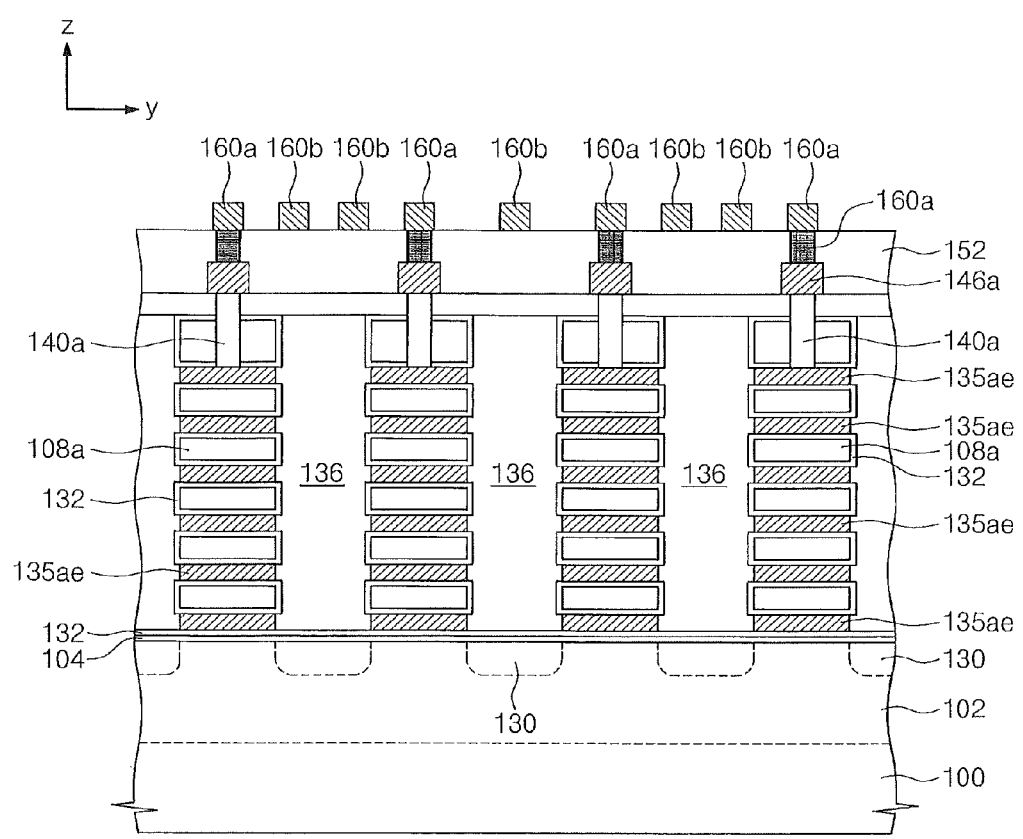
FIG. 2D is a sectional view taken along the line IV-IV' of FIG. 1.
Figure 2E:
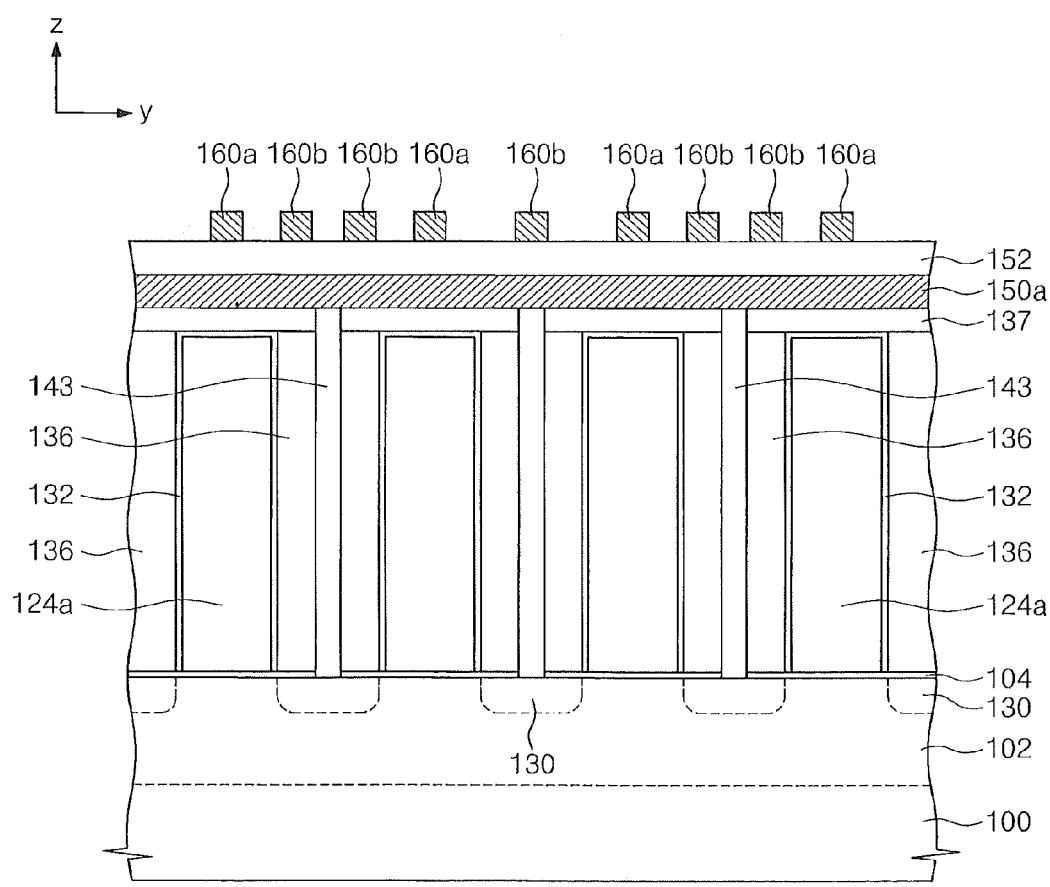
FIG. 2E is a sectional view taken along the line V-V' of FIG. 1.

As illustrated in FIGS. 1, 2A, and 2E, a plurality of capping insulation patterns 124a may be disposed in the strapping region 80. The capping insulation patterns 124a may be spaced apart from each other in the second direction. Each of the capping insulation patterns 124a may be included in each of the vertical-type string groups. Each of the capping insulation patterns 124a covers the extensions 135ae of the first sub-gates 135a and the extensions 135be of the second sub-gates 135b, which are located below the uppermost first and second sub-gates 135au and 135bu, respectively. Each of the capping insulation patterns 124a may not cover the extensions 135ae and 135be of the uppermost first and second sub-gates 135au and 135bu. Each of the capping insulation patterns 124a may have sidewalls aligned with sidewalls of the extensions of the dielectric patterns 108a. The upper surfaces of the capping insulation patterns 124a may be coplanar with the upper surfaces of the uppermost dielectric patterns 108 located on the uppermost first and second sub-gates 135au and 135bu. The capping insulation patterns 124a may be formed of insulating materials having the same etching rate as the dielectric patterns 108a. According to the first embodiment of the inventive concept, the data storage layer 132 may extend so as to be disposed on the upper surface of the capping insulation pattern 124a. Alternative, the data storage layer 132 may not cover the upper surface of the capping insulation pattern 124a.

A device isolation pattern 136 may be disposed between the adjacent vertical-type string groups. The device isolation pattern 136 may extend toward the first direction and may pass through the first sub-cell region 85a, the strapping region 80, and the second sub-cell region 85b. The device isolation pattern 136 may contain, for example, an oxide, a nitride, and/or an oxynitride.

A common source region 130 may be disposed in the substrate 100 under the device isolation pattern 136. The common source region 130 is doped with the second-type dopant. The common source region 130 is disposed in the well region 102. More specifically, the lower surface of the common source region 130 is higher than that of the well region 102. For this reason, the lower surface of the common source region 130 is covered with the lower surface of the well region 102. The upper surface of the common source region 130 may have the level equal to that of the substrate 100. The common source region 130 may have a line shape extending in the first direction. The common source region 130 may be disposed in the first sub-cell region 85a, the strapping region 80, and the second sub-cell region 85b. A plurality of the common source regions 130 may be disposed in parallel with each other in the cell array region 90. The common source regions 130 may be spaced apart from each other in the second direction. The vertical-type string group may be disposed between a pair of the common source regions 130 adjacent to each other.

A first interlayer dielectric layer 137 may be disposed on the vertical-type string groups and the device isolation patterns 136. A first bitline 145a may be disposed on the first interlayer dielectric layer 137 in the first sub-cell region 85a. The first bitline 145a may be electrically connected to a top end of the first vertical-type channel pattern 115a. Specifically, the first bitline 145a may be electrically connected to the drain region 120 in the first vertical-type channel pattern 115a. The first bitline 145a may be provided in a plural number in the first sub-cell region 85a. The first bitlines 145a may extend in parallel with each other in the second direction. Each of the first bitlines 145a may be electrically connected to the top ends of the first vertical-type channel patterns 115a that are arranged along the second direction to form one column and that are included in the vertical-type string groups, respectively.

Similarly, a second bitline 145b may be disposed on the first interlayer dielectric layer 137 in the second sub-cell region 85b. The second bitline 145b may be electrically connected to a top end of the second vertical-type channel pattern 115b. The second bitline 145b may be electrically connected to the drain region 120 in the second vertical-type channel pattern 115b. The second bitline 145b may be provided in a plural number in the second sub-cell region 85b. The plural second bitlines 145b may extend in parallel with each other in the second direction. Each of the second bitlines 145b may be electrically connected to the top parts of the second vertical-type channel patterns 115b that are arranged along the second direction to form one column and that are included in the vertical-type string groups, respectively.

The first and second bitlines 145a and 145b may be located at the same level from the top surface of the substrate 100. The first and second bitlines 145a and 145b may be formed of the same conductive material. The first and second bitlines 145a and 145b may be formed of at least one selected from a group comprising metals (ex., tungsten, titanium, tantalum, aluminum, and/or copper) and conductive metal nitrides (ex., titanium nitride or tantalum nitride). The first and second bitlines 145a and 145b may electrically be connected to the top ends of the first and second vertical-type channel pattern 115a and 115b via bitline contact pillars 139, respectively. The bitline contact pillars 139 may penetrate the first interlayer dielectric layer 137 to be connected to the capping semiconductor pattern 122.

A plurality of strapping lines 160a and 160b may be formed over the substrate 100 to extend in parallel with each other in the first direction. The strapping lines 160a and 160b may correspond to interconnections. The strapping lines 160a and 160b may successively be disposed in the first sub-cell region 85a, the strapping region 80 and the second sub-cell region 85b. The strapping lines 160a and 160b may cross over the first and second bitlines 145a and 145b. The strapping lines 160a and 160b are insulated from the first and second bitlines 145a and 145b. For example, a second interlayer dielectric layer 152 may be disposed on the first and second bitlines 145a and 145b and the first interlayer dielectric layer 137, and then the strapping lines 160a and 160b may be disposed on the second interlayer dielectric layer 152.

The strapping lines 160a and 160b may include a plurality of firsts strapping lines 160a and a plurality of second strapping lines 160b. Each of the first strapping lines 160a is electrically connected to the extension 135ae of the uppermost first sub-gate 135au and the extension 135be of the uppermost second sub-gate 135bu in each of the vertical-type string groups. Accordingly, the number of first strapping lines 160a may be equal to that of the vertical-type string groups.

Each of the second strapping lines 160b may be electrically connected to the extensions 135ae of a plural first sub-gates 135a and the extensions 135be of a plural second sub-gates 135b which are located at the same level. The extensions 135ae and 135be of the first and second sub-gates 135a and 135b, which are electrically connected to each of the second strapping lines 160b, are disposed lower than the extensions of the uppermost first and second sub-gates 135au and 135bu. The plural first sub-gates 135a and the plural second sub-gates 135b, which are electrically connected to each of the second strapping lines 160b, may be included in the plurality of vertical-type string groups, respectively. For this reason, the number of second strapping lines 160b may be equal to a stacked number of the first sub-gates 135a except for the uppermost first sub-gate 135au. That is, each of the first strapping lines 160a and the plural second strapping lines 160b may be electrically connected to the extensions 135ae of the stacked first sub-gates 135a and 135au, respectively, and electrically connected to the extensions 135be of the stacked second sub-gates 135b and 135bu, respectively.

A plurality of first local interconnections 147a and a plurality of second local interconnections 147b may be disposed in the strapping region 80. The first and second local interconnections 147a and 147b may extend in parallel with each other along the second direction. In other words, the first and second local interconnections 147a and 147b may be parallel to the first and second bitlines 145a and 145b. The first and second local interconnections 147a and 147b may be located at the same level as the first and second bitlines 147a and 147b. That is, the first and second local interconnections 147a and 147b may be interposed between the second interlayer dielectric layer 152 and the first interlayer dielectric layer 137. Each of the first local interconnections 147a may be electrically connected to the extensions 135ae of the first sub-gates 135a being located at the same level and being disposed below the uppermost first sub-gate 135au. Each of the second local interconnections 147b may be electrically connected to the extensions 135be of the second sub-gates 135b being located at the same level and being disposed below the uppermost second sub-gate 135bu.

Contact pillars 141 may be disposed between the first local interconnections 147a and the extensions 135ae of the first sub-gates 135a, respectively. Each of the contact pillars 141 may come in contact with the each of extensions 135ae of the first sub-gates 135a by penetrating successively the first interlayer dielectric layer 137, the capping insulation pattern 124a, the extension of the dielectric pattern 108a, and the extension of the data storage layer 132. A plurality of contact pillars 141 may be disposed below each of the first local interconnections 147a and be arranged in the second direction. The contact pillars 141 disposed below each of the first local interconnections 147a may be connected to the extensions 135ae of the first sub-gates 135a being located at the same level, respectively. Similarly, contact pillars 141 may be disposed between the second local interconnections 147b and the extensions 135be of the second sub-gates 135b, respectively. A plurality of contact pillars 141 may be disposed below each of the second local interconnections 147b and be arranged in the second direction. The contact pillars 141 below each of the second local interconnections 147b may be connected to the extensions 135be of the second sub-gates 135b being located at the same level, respectively. The first and second local interconnections 147a and 147b may be formed of the same conductive material as the first and second bitlines 145a and 145b.

As illustrated in FIGS. 1, 2A, and 3, a first conductive pad 146a may be disposed over each of the extensions 135ae of the uppermost first sub-gates 135au, and a second conductive pad 146b may be disposed over each of the extensions 135be of the uppermost second sub-gates 135bu. a plurality of the first conductive pads 146a, which correspond to the plurality of vertical-type string groups, respectively, may be arranged so as to be spaced apart from each other along the second direction. Similarly, a plurality of the second conductive pads 146b, which correspond to the plurality of vertical-type string groups, respectively, may be arranged so as to be spaced apart from each other along the second direction. The first and second conductive pads 146a and 146b may be located at the same level as the first and second bitlines 145a and 145b. The first and second conductive pads 146a and 146b may be disposed on the first interlayer dielectric layer 137 and below the second interlayer dielectric layer 152. The first conductive pad 146a may electrically be connected to the extension 135ae of the uppermost first sub-gate 135au via a first contact pillar 140a disposed below the first conductive pad 146a. The first contact pillar 140a may penetrate the first interlayer dielectric layer 137, the dielectric pattern 108a, and the extension of the data storage layer 132. The second conductive pad 146b may electrically be connected to the extension 135be of the uppermost second sub-gate 135bu via a second contact pillar 140b disposed below the second conductive pad 146b. The second contact pillar 140b may penetrate the first interlayer dielectric layer 137, the dielectric pattern 108a, and the extension of the data storage layer 132. The first and second conductive pads 146a and 146b may be formed of the same conductive material as the first and second bitlines 145a and 145b.

Each of the first strapping lines 160a may electrically be connected to the extensions 135ae and 135be of the uppermost first and second sub-gates 135au and 135bu in each of the vertical-type string groups via the first and second conductive pads 146a and 146b. Each of the first strapping lines 160a may be electrically be connected to the first and second conductive pads 146a via first strapping contact pillars 155a penetrating the second interlayer dielectric layer 152.

Each of the second strapping lines 160b may be electrically connected to the first local interconnection 147a and the second local interconnection 147b that are connected to the extensions 135ae of the first sub-gates 135a and the extensions 135be of the second sub-gates 135b being located at the same level. Each of the second strapping lines 160b may electrically be connected to the first local interconnection 147a and the second local interconnection 147b via second strapping contact pillars 155b penetrating the second interlayer dielectric layer 152.

Preferably, the strapping lines 160a and 160b have lower resistivity than the sub-gates 135a, 135au, 135b, and 135bu. For instance, the strapping lines 160a and 160b may include aluminum and/or copper.

The strapping lines 160a and 160b having the lower resistivity are connected to the extensions 135ae and the extensions 135be which are the terraced structures. Therefore, operational voltages can be supplied to the sub-gates 135a, 135au, 135b, and 135bu in more rapid speed through the strapping lines 160a and 160b. In other words, it is possible to reduce the resistance between the sub-gates 135a, 135au, 135b, and 135bu and the power source due to the strapping lines 160a and 160b. Furthermore, it is possible to uniformly apply the operational voltages to the first sub-gates 135a and 135au and the second sub-gates 135b and 135bu due to the strapping lines 160a and 160b. As a result, it is possible to realize the three-dimensional semiconductor memory device having good reliability and capable of operating in high speed.

As illustrated in FIGS. 2C, 2D, and 3, the first strapping lines 160a and the second strapping lines 160b may be located at the same level. At this time, as illustrated in FIG. 1, the first strapping lines 160a may be arranged at equal intervals in the second direction. In this case, one or more second strapping lines 160b may be disposed between a pair of first strapping lines 160a adjacent to each other.

As illustrated in FIGS. 1, 2A, 2E, and 3, a conductive line 150a may be disposed in the strapping region 80 to extend in the second direction. That is, the conductive line 150a may be parallel to the first and second bitlines 145a and 145b. The conductive line 150a may electrically be connected to a part of the top surface of the substrate 100 in the strapping region 80. The conductive line 150a may electrically be connected to parts of the common source regions 130 formed in the substrate 100 in the strapping region 80. The conductive line 150a may include a conductive material having lower resistivity than the common source region 130. The conductive line 150a may be located at the same level as the first and second bitlines 145a and 145b. That is, the conductive line 150a may be disposed on the first interlayer dielectric layer 137 and below the second interlayer dielectric layer 152. The conductive line 150a may be formed of the same material as the first and second bitlines 145a and 145b.

The conductive line 150a may electrically be connected to the common source regions 130 via the contact pillars 143 disposed below the conductive line 150a. The contact pillar 143 may come in contact with the common source region 130 by penetrating successively the first interlayer dielectric layer 137, the device isolation pattern 136, and the buffer dielectric layer 104. A reference voltage may be supplied to the common source region 130 through the conductive line 150a. The reference voltage may rapidly be supplied to the common source region by the conductive line 150a having lower resistivity than the common source region 130. In addition, since the conductive line 150a is disposed in the strapping region 80, the reference voltage may be supplied to the common source region in the first sub-cell region 85a and the common source region 130 in the second sub-cell region 85b in more rapid speed.

According to one embodiment of the inventive concept, the conductive line, which is electrically connected to a part of the top surface of the substrate 100 in the strapping region 80, may supply a well voltage to the well region 102. This will be described with reference to FIG. 2F.

Figure 2F:
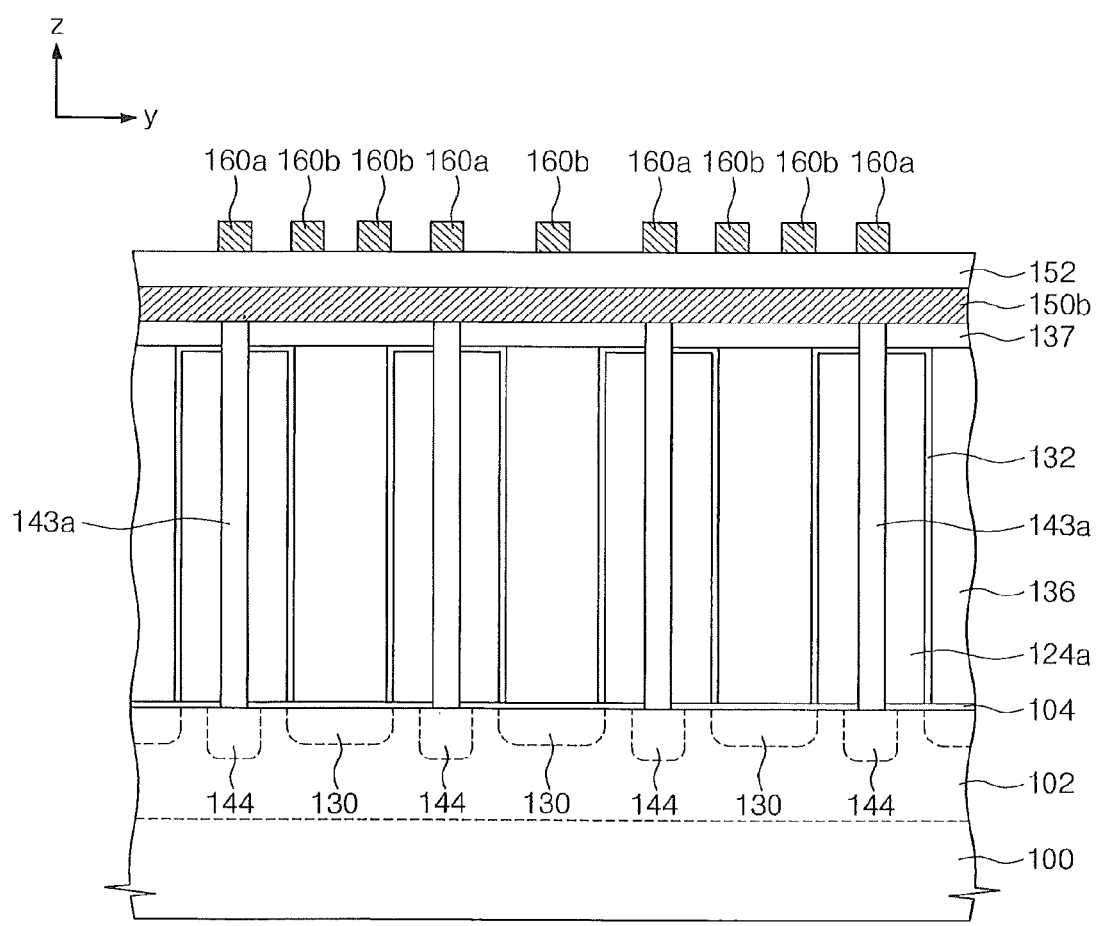
FIG. 2F is a sectional view taken along the line V-V' of FIG. 1 to explain a modified example of a conductive line electrically connected to a part of a top surface of a substrate in a strapping region included in the three-dimensional semiconductor memory device according to the first embodiment of the inventive concept.

FIG. 2F is a sectional view taken along the line V-V' of FIG. 1 to explain a modified example the conductive line electrically connected to a part of the top surface of the substrate in the strapping region included in the three-dimensional semiconductor memory device according to the first embodiment of the inventive concept.

Referring to FIG. 2F, a conductive line 150b according to one embodiment of the inventive concept may electrically be connected to the well region 102 formed in the substrate 100 in the strapping region 80. The conductive line 150b may electrically be connected to the well region 102 through a contact pillar 143a disposed below the conductive line 150b. The contact pillar 143a may come in contact with a part of the top surface of the substrate 100 in the strapping region 80 by penetrating successively the first interlayer dielectric layer 137, the extension of the data storage layer 132, the capping insulation pattern 124a, and the buffer dielectric layer 104. A well pickup region 144 may be disposed in the substrate 100 in the well region 102 within the strapping region 80. The contact pillar 143a may electrically be connected to the well region 102 via the well pickup region 144. The well pickup region 144 may be doped with dopants having the same type (that is, first-type) as the well region 102. At this time, a dopant concentration of the well pickup region 144 may be higher than that of the well region 102. The conductive line 150b may be located at the same level as the first and second bitlines 145a and 145b. The conductive line 150b may be formed of the same material as the first and second bitlines 145a and 145b.

As illustrated in FIG. 1, the first strapping lines 160a may be disposed at equal intervals. Alternatively, the first strapping lines 160a and the second strapping lines 160b may be disposed with various intervals and/or with various locations. Modified examples related to the planar location of these strapping lines 160a and 160b will be described with reference to drawings.

Figure 4A:
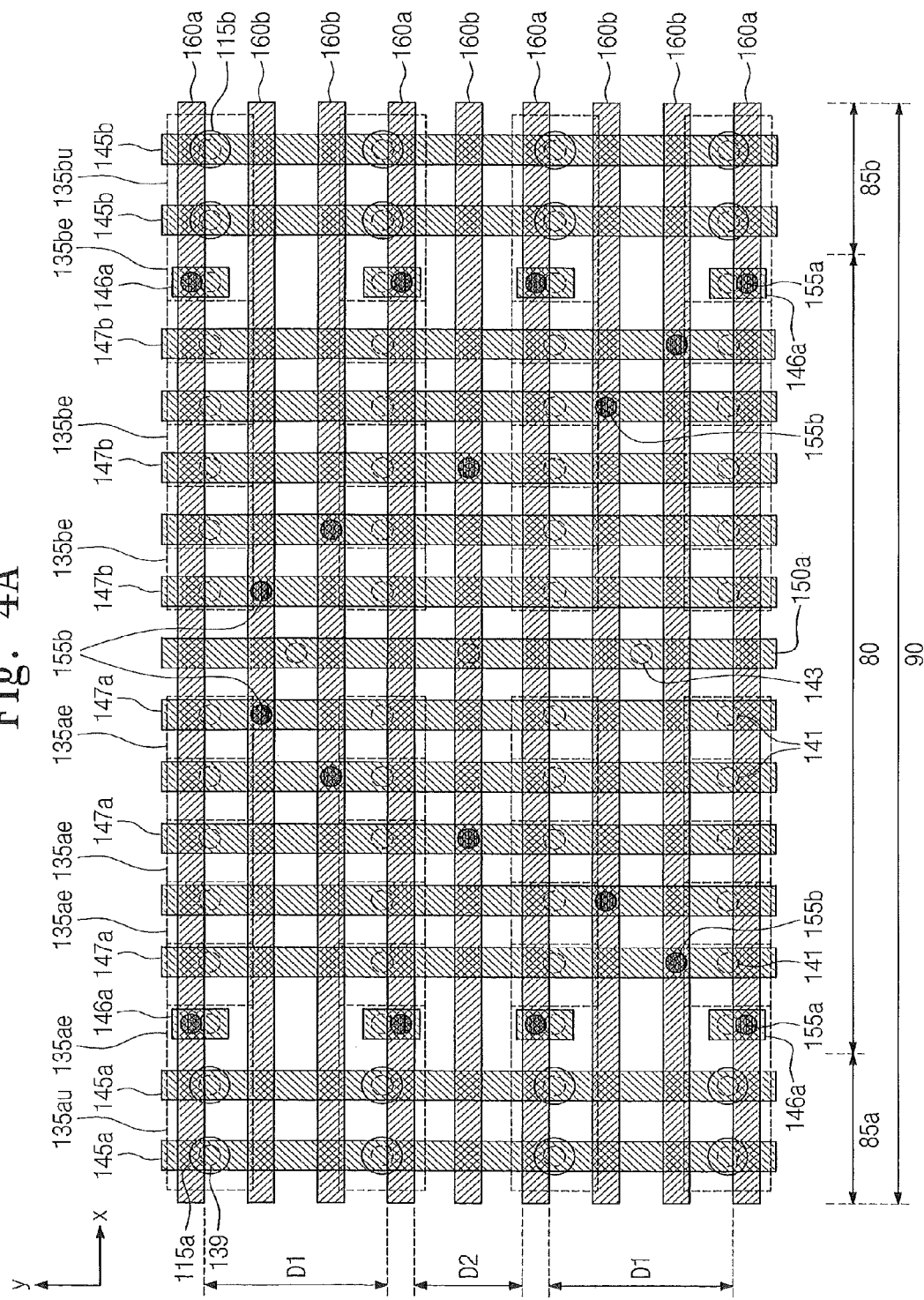
FIG. 4A is a plan view illustrating one modified example of the three-dimensional semiconductor memory device according to the first embodiment of the inventive concept.

FIG. 4A is a plan view illustrating one modified example of the three-dimensional semiconductor memory device according to the first embodiment of the inventive concept.

Referring to FIG. 4A, the strapping lines 160a may include a plurality of line groups. Each of the line groups may include a pair of strapping lines 160a spaced apart from each other at a first interval D1 in the second direction. The plurality of line groups may be spaced apart from each other at a second interval D2 in the second direction. At this time, the second interval D2 may be shorter than the first interval D1. The number of second strapping lines 160b between a pair of the line groups with the second interval D2 may be less than the number of second strapping lines 160b between the pair of first strapping lines 160a with the first interval D1. In other words, the first strapping lines 160a may be spaced apart from each other at the first interval D1 and the second interval D2, which are different from each other. At this time, m (m is a natural number) second strapping lines 160b may be disposed between the pair of first strapping lines 160a spaced apart from each other at the relatively narrow second interval D2, and n (n is larger than m) second strapping lines 160b may be disposed between the pair of first strapping lines 160a spaced apart from each other at the relatively wide first interval D1. This can reduce the interval between the vertical-type string groups and/or line widths of the line-shaped sub-gates 135a, 135au, 135b, and 135bu. As a result, it is possible to realize a higher integrated three-dimensional semiconductor memory device. According to this modified example, it is possible to dispose both of the first and second strapping lines 160a and 160b at the equal intervals.

It is possible to arrange the first strapping lines 160a at the first interval D1 and the second interval D2 by adjusting the lengths of the first and second conductive pads 146a and 146b in the second direction.

Figure 4B:
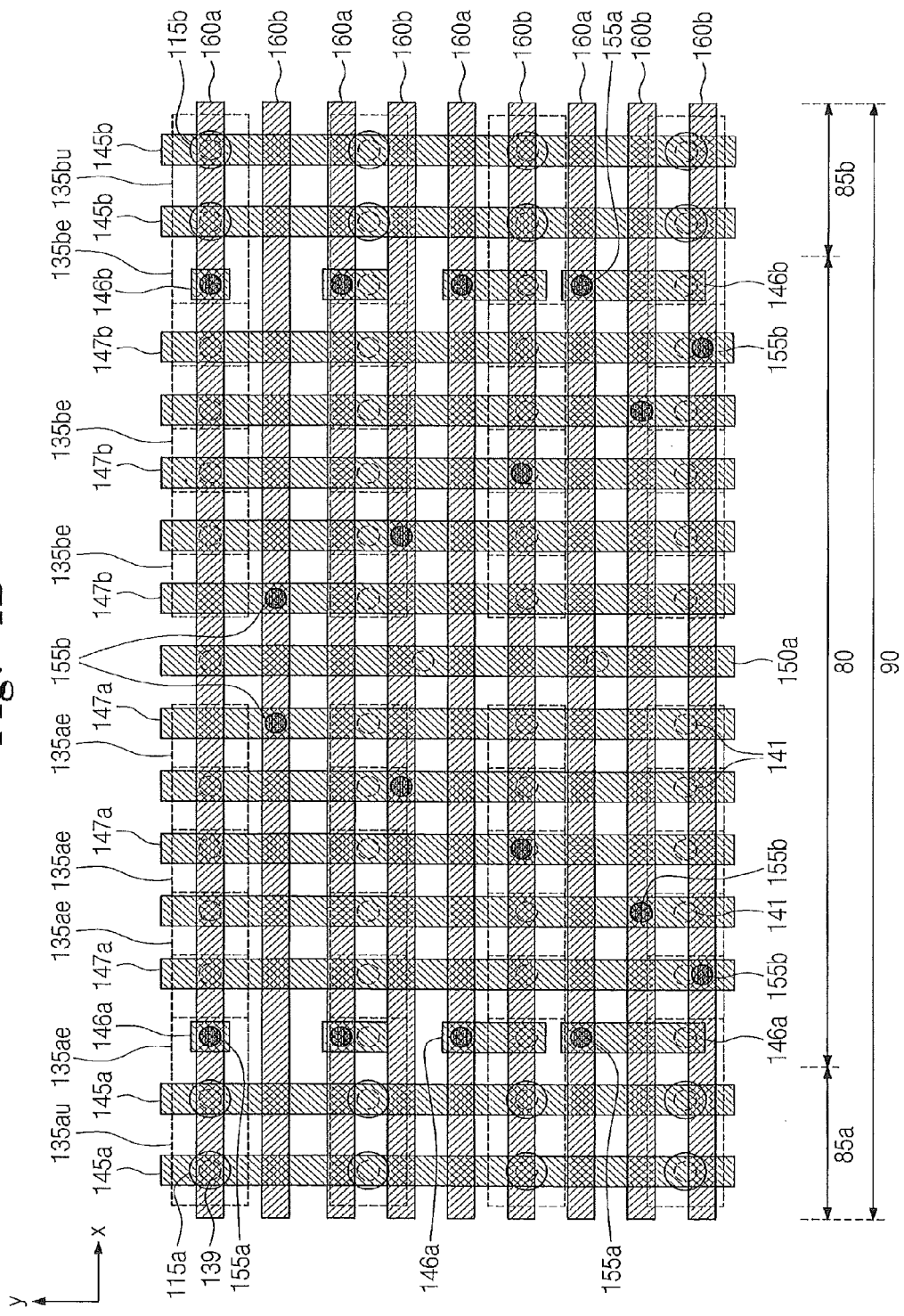
FIG. 4B is a plan view illustrating another modified example of the three-dimensional semiconductor memory device according to the first embodiment of the inventive concept.

FIG. 4B is a plan view illustrating another modified example of the three-dimensional semiconductor memory device according to the first embodiment of the inventive concept.

Referring to FIG. 4B, at least one of the first strapping lines 160 may be not overlapped with the uppermost first and second sub-gates 135au and 135bu that are electrically connected thereto. Specifically, it is possible to adjust the intervals of the first strapping lines 160a and the second strapping lines 160b by adjusting the lengths of the first and second conductive pads 146a and 146b in the second direction (ex., y-axis). In this case, the intervals between the vertical-type string groups and the line widths of the sub-gates 135a, 135au, 135b, and 135bu may further be reduced. In addition, the first and second strapping lines 160a and 160b may more easily be arranged at locations required by the periphery circuits.

Figure 4C:
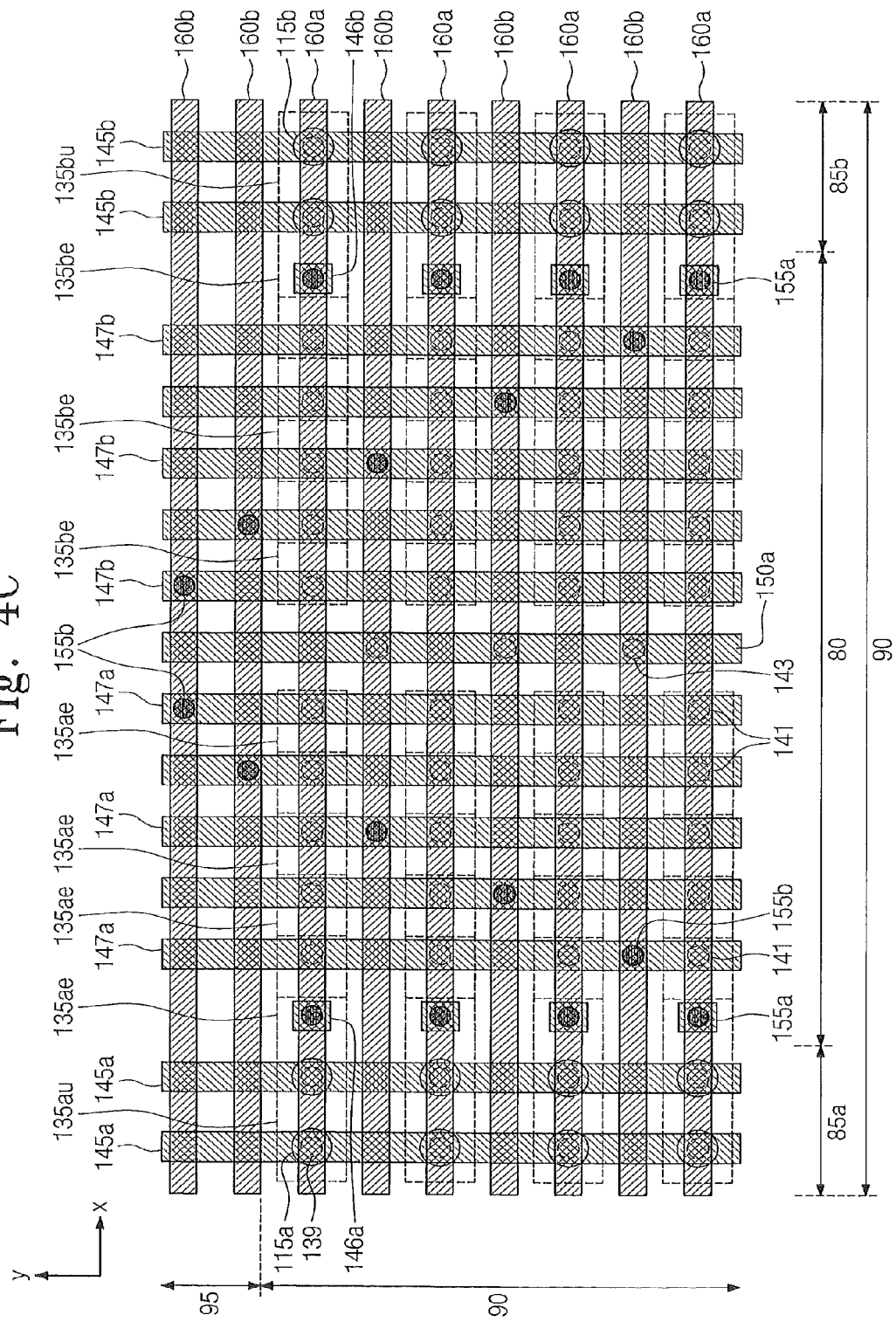
FIG. 4C is a plan view illustrating still another modified example of the three-dimensional semiconductor memory device according to the first embodiment of the inventive concept.

FIG. 4C is a plan view illustrating still another modified example of the three-dimensional semiconductor memory device according to the first embodiment of the inventive concept.

Referring to FIG. 4C, the substrate 100 may further include an external region 95 located at one side of the cell array region 90 in the second direction (i.e. y-axis in FIG. 4C). That is, the cell array region 90 and the external region 95 may be arranged along the second direction. At this time, some of the second strapping lines 160b may be disposed in the cell array region 90, and the others may be disposed in the external region 95. In this case, the first and second local interconnections 147a and 147b, which are electrically connected to the second strapping lines 160b disposed in the external region 95, may extend into the external region 95. As illustrated in FIG. 4C, all of the local interconnections 147a and 147b may extend into the external region 95. According to this modified example, the first strapping lines 160a may be disposed over the vertical-type string groups, respectively. And one of the second strapping lines 160b may be disposed between the pair of first strapping lines 160a adjacent to each other. The second strapping lines 160b, which are not disposed between the first strapping lines 160a, may be disposed in the external region 95. In this case, the intervals between the vertical-type string groups and/or the line widths of the sub-gates 135a, 135au, 135b, and 135bu may be minimized. Moreover, all of the first and second strapping lines 160*a* and 160*b* may be arranged at the equal intervals.

In the above-described three-dimensional semiconductor memory device, meanwhile, the conductive line 150*a* or 150*b* may electrically be connected to the common source region 130 or the well region 102 in the strapping region 80. According to one embodiment, the three-dimensional semiconductor memory device may include both the conductive line 150*a* connected to the common source region 130 and the conductive line 150*b* connected to the well region 102. This will be described with reference to drawings.

Figure 4D:
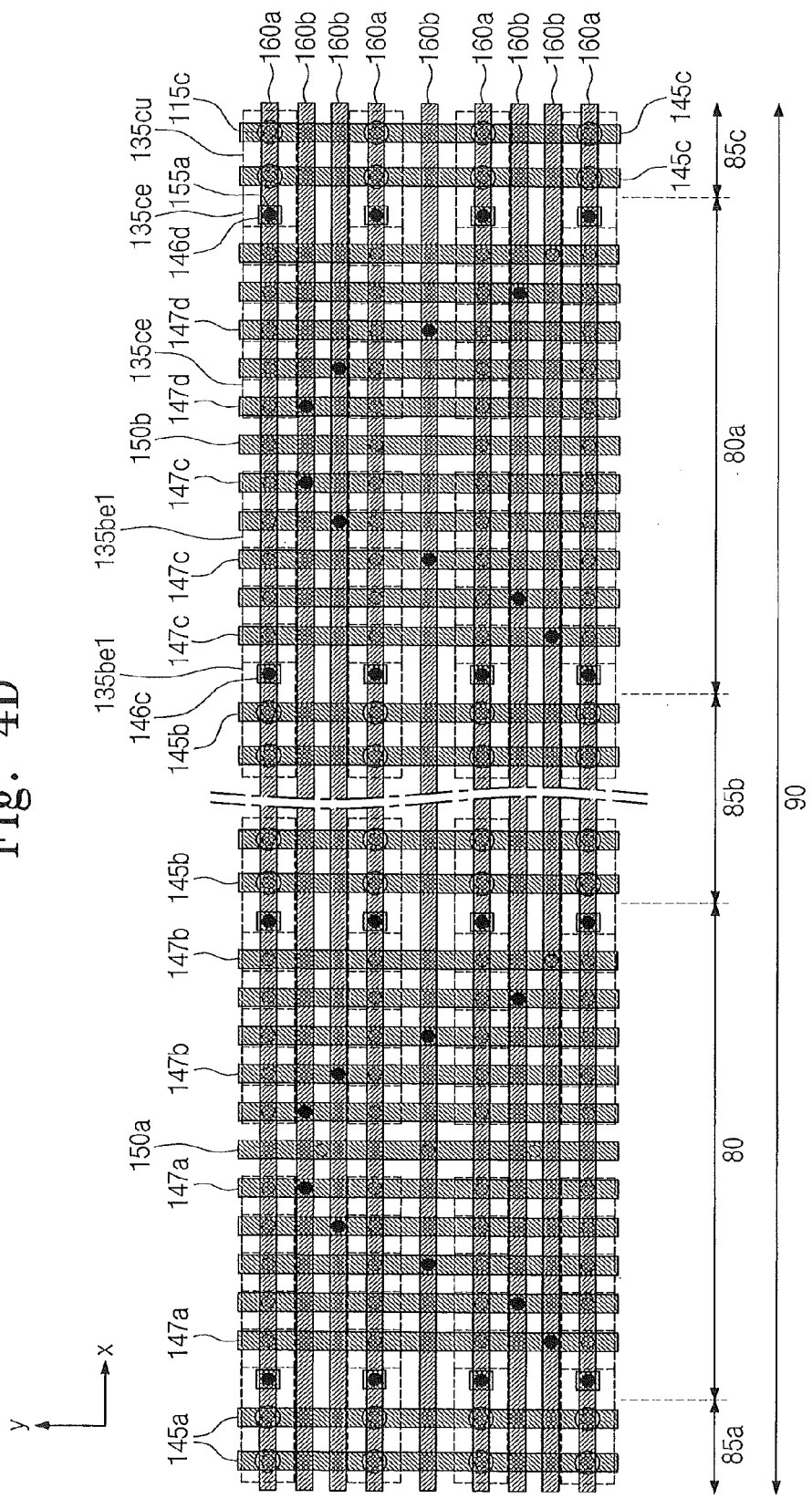
FIG. 4D is a plan view illustrating still another modified example of the three-dimensional semiconductor memory device according to the first embodiment of the inventive concept.

FIG. 4D is a plan view illustrating still another modified example of the three-dimensional semiconductor memory device according to the first embodiment of the inventive concept.

Referring to FIG. 4D, the substrate 100 may have the cell array region 90. The cell array region 90 may include first, second, and third sub-cell regions 85*a*, 85*b*, and 85*c*. Moreover, the cell array region 90 may include first and second strapping regions 80 and 80*a*. The first strapping region 80 may be interposed between the first and second sub-cell regions, and the second strapping region 80*a* may be interposed between the second and third sub-cell regions 85*b* and 85*c*.

The structures of the memory devices in the first and second sub-cell regions 85*a* and 85*b* and the first strapping region 80 may be the same as those of the memory devices described with reference to FIGS. 1, 2A through 2E, and 3. Each of the second sub-gates stacked on the substrate 100 in the second sub-cell regions 85*b* may further include an extension 135*bel* extending laterally into the second strapping region 80*a*. Third sub-gates may be sequentially stacked on the substrate in the third sub-cell region 85*c*. Each of the stacked third sub-gates may have an extension 135*ce* extending laterally into the second strapping region 80*a*. Preferably, the extensions 135*ce* of the stacked third sub-gates may have a terraced structure. A third vertical-type channel pattern 115*c* may successively penetrate the stacked third sub-gates. The shape of the third vertical-type channel pattern 115*c* may be equal to that of the first vertical-type channel pattern 115*a*, and the third vertical-type channel pattern 115*c* may be formed of the same material as the first vertical-type channel pattern 115*a*. Furthermore, a drain region may be formed at an upper portion of the third vertical-type channel pattern 115*c*. The data storage layer may be further interposed between the third vertical-type channel pattern 115*c* and the stacked third sub-gates, and dielectric patterns may be interposed between the stacked third sub-gates, respectively. A third bitline 145*c* may be electrically connected to a top end of the third vertical-type channel pattern 115*c*. The third bitline 145*c* may be formed of the same material as the first and second bitlines 145*a* and 145*b*. Moreover, the third bitline 145*c* may be located at the same level as the first and second bitlines 145*a* and 145*b*. The stacked third sub-gates may have a line shape extending in the first direction. The first direction may be an x-axis in FIG. 4D.

Each of the vertical-type string group described with reference to FIGS. 1 2A through 2E, and 3 may further include the stacked third sub-gates and the third vertical-type channel pattern 115*c*. The common source region 130 described with reference to FIGS. 1 2A through 2E, and 3 may further extend so as to be successively disposed in the second strapping region 80*a* and the third sub-cell region 85*c*, also the well region 102 may extend into the substrate 100 in the second strapping region 80*a* and the third sub-cell region 85*c*.

Third local interconnections 147*c* and fourth local interconnections 147*d* may be disposed in the second strapping region 80*a* so as to extend in parallel with each other in the second direction. The second direction may be y-axis in FIG. 4D. The third and fourth local interconnections 147*c* and 147*d* may be parallel to the first and second local interconnections 147*a* and 147*b*. Each of the third local interconnections 147*c* may be electrically connected to the extensions 135*bel* of the second sub-gates which are located at the same level and are disposed below the uppermost second sub-gates. Each of the fourth local interconnections 147*d* may be electrically connected to the extensions 135*ce* of the third sub-gates which are located at the same level and are disposed below the uppermost third sub-gates 135*cu*. The third and fourth local interconnections 147*c* and 147*d* may be located at the same level as the first and second local interconnections 147*a* and 147*b*. And the third and fourth local interconnections 147*c* and 147*d* may be formed of the same material as the first and second local interconnections 147*a* and 147*b*. A third conductive pad 146*c* may electrically be connected to the extension 135*bel* of each of the uppermost second sub-gates disposed in the second strapping region 80*a*. A fourth conductive pad 146*d* may electrically be connected to the extension 135*ce* of each of the uppermost third sub-gates 135*cu* disposed in the second strapping region 80*a*. The third and fourth conductive pads 146*c* and 146*d* may be located at the same level as the first and second conductive pads 146*a* and 146*b*. And the third and fourth conductive pads 146*c* and 146*d* be formed of the same material as the first and second conductive pads 146*a* and 146*b*.

Each of the first strapping lines 160*a* may be included in each of the vertical-type string groups. Each of the first strapping lines 160*a* may be electrically connected to the extensions 135*ae*, 135*be*, 135*bel*, and 135*ce* of the uppermost first, second, and third sub-gates disposed, in the first and second strapping regions 80 and 80*a*. Each of the second strapping line 160*b* may be disposed below the uppermost sub-gate. Each of the second strapping line 160*b* may be electrically connected to the first, second, third and fourth local interconnections 147*a*, 147*b*, 147*c* and 147*d*, which are electrically connected to the extensions being located at the same level and being disposed below the uppermost sub-gates.

The first conductive line 150*a* described with reference to FIG. 2E may be disposed in the first strapping region 80. As described above, the first conductive line 150*a* may electrically be connected to the common source region. The second conductive line 150*b* described with reference to FIG. 2F may be disposed in the second strapping region 80*a*. The second conductive line 150l) may extend in parallel with the first conductive line 150*a*. As described with reference to FIG. 2F, the second conductive line 150 may electrically be connected to the well region in the second strapping region 80*a*.

In the three-dimensional semiconductor memory device described with reference to FIGS. 1, 2A through 2E, and 3, the first and second strapping lines 160*a* and 160*b* may be located at the same level. Alternatively, some of the strapping lines may be located at the different level from the others. This will be described with reference to FIG. 5.

Figure 5:
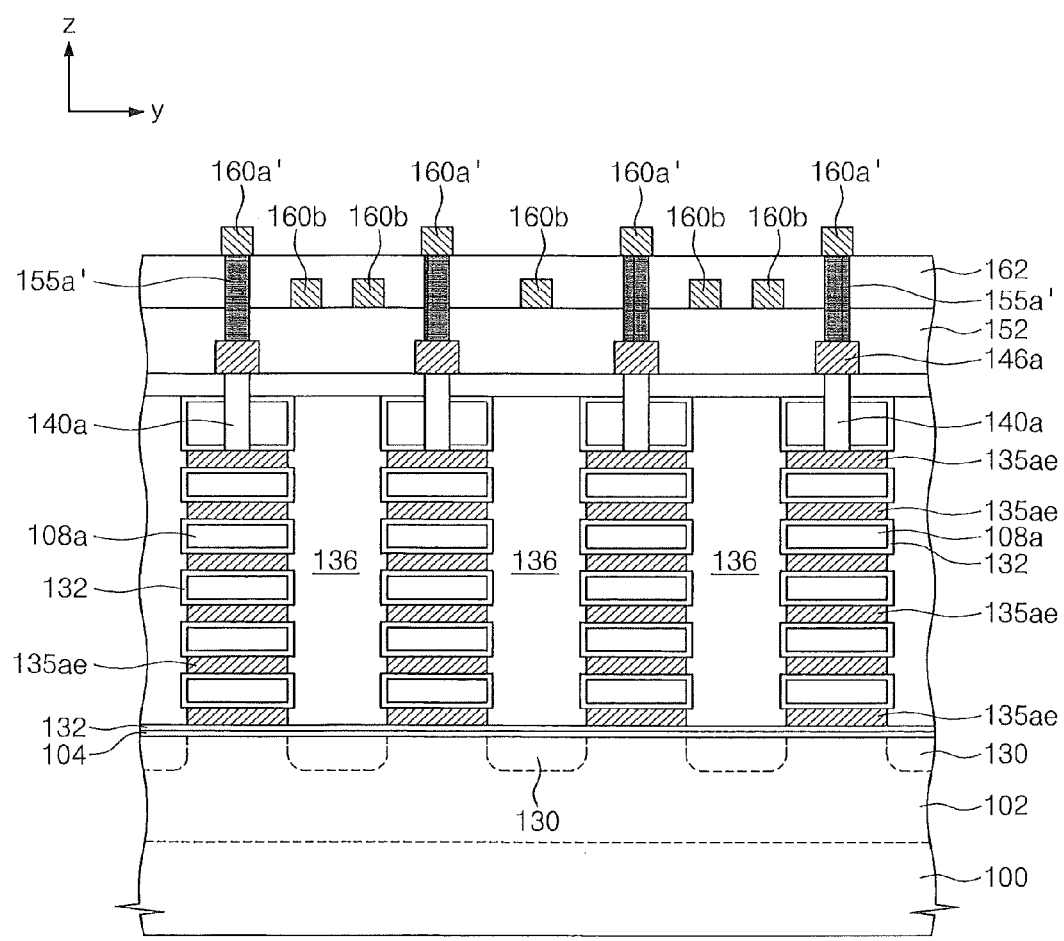
FIG. 5 is a sectional view taken along the line IV-IV' of FIG. 1 to explain still another modified example of the three-dimensional semiconductor memory device according to the first embodiment of the inventive concept.

FIG. 5 is a sectional view taken along the line IV-IV' of FIG. 1 to explain still another modified example of the three-dimensional semiconductor memory device according to the first embodiment of the inventive concept.

Referring to FIG. 5, first strapping lines 160*a*' being electrically connected to the extensions 135*ae* of the uppermost sub-gates may be located at the different level from second strapping lines 160*b*. For instance, the first strapping lines 160*a*' may be disposed higher than the second strapping lines 160*b*. In this case, a third interlayer dielectric layer 162 may disposed on the second strapping lines 160*b* and the second interlayer dielectric layer 152, and the first strapping lines 160a' may be disposed on the third interlayer dielectric layer 162. In this case, a first strapping contact pillar 155a' may penetrate the third interlayer dielectric layer 162 and the second interlayer dielectric layer 152 to make a connection between the first strapping line 160a' and the conductive pad 146a.

Since the first strapping lines 160a' may be disposed higher than the second strapping lines 160b, it is possible to reduce the interval between the second strapping lines 160b. This can reduce the interval between the vertical-type string groups and/or the line width of the sub-gates and realize the highly integrated three-dimensional semiconductor memory device. For instance, the first strapping contact pillar 155a' may be insulated from the second strapping line 160b adjacent thereto by a spacer (not illustrated) on the sidewall of the second strapping line 160b and/or a hole spacer (not illustrated) between the first strapping contact pillar 155a' and the interlayer dielectric layers 162 and 152. Accordingly, the interval between the first strapping contact pillar 155a' and the second strapping line 160b can be reduced more than the minimum interval according to the design rule.

Even in this case, the first strapping lines 160a' may be disposed in the same manner as the first strapping lines 160a illustrated in FIG. 4A or 4B in plan view. In the three-dimensional semiconductor memory device according to this modified example, some of the second strapping region 160b may be disposed at the external region as illustrated in FIG. 4C. In this modified example, the first strapping lines 160a' may be located higher than the second strapping lines 160b. Alternatively, the second strapping lines 160b may be disposed higher than the first strapping lines 160a'.

In the above-described three-dimensional semiconductor memory device, the uppermost sub-gates 135au and 135bu and the sub-gates 135a and 135b located therebelow may have a line shape extending in the first direction. Alternatively, the sub-gates, which are located below the uppermost sub-gates and located at the same level, extend laterally to be in contact with each other, thereby forming a plate shape. This will be described with reference to drawings.

Figure 6A:
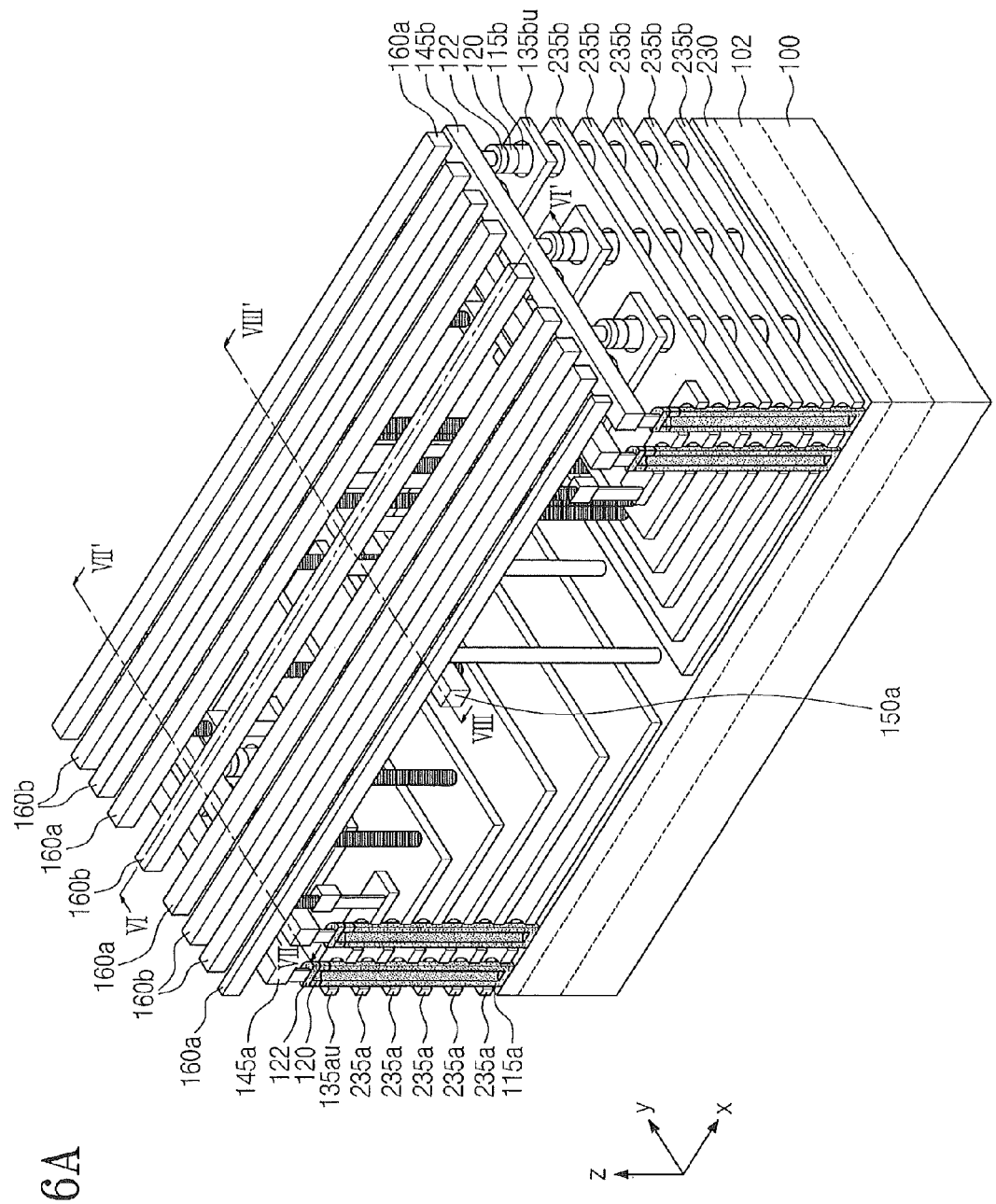
FIG. 6A is a perspective view illustrating still another modified example of the three-dimensional semiconductor memory device according to the first embodiment of the inventive concept.
Figure 6B:
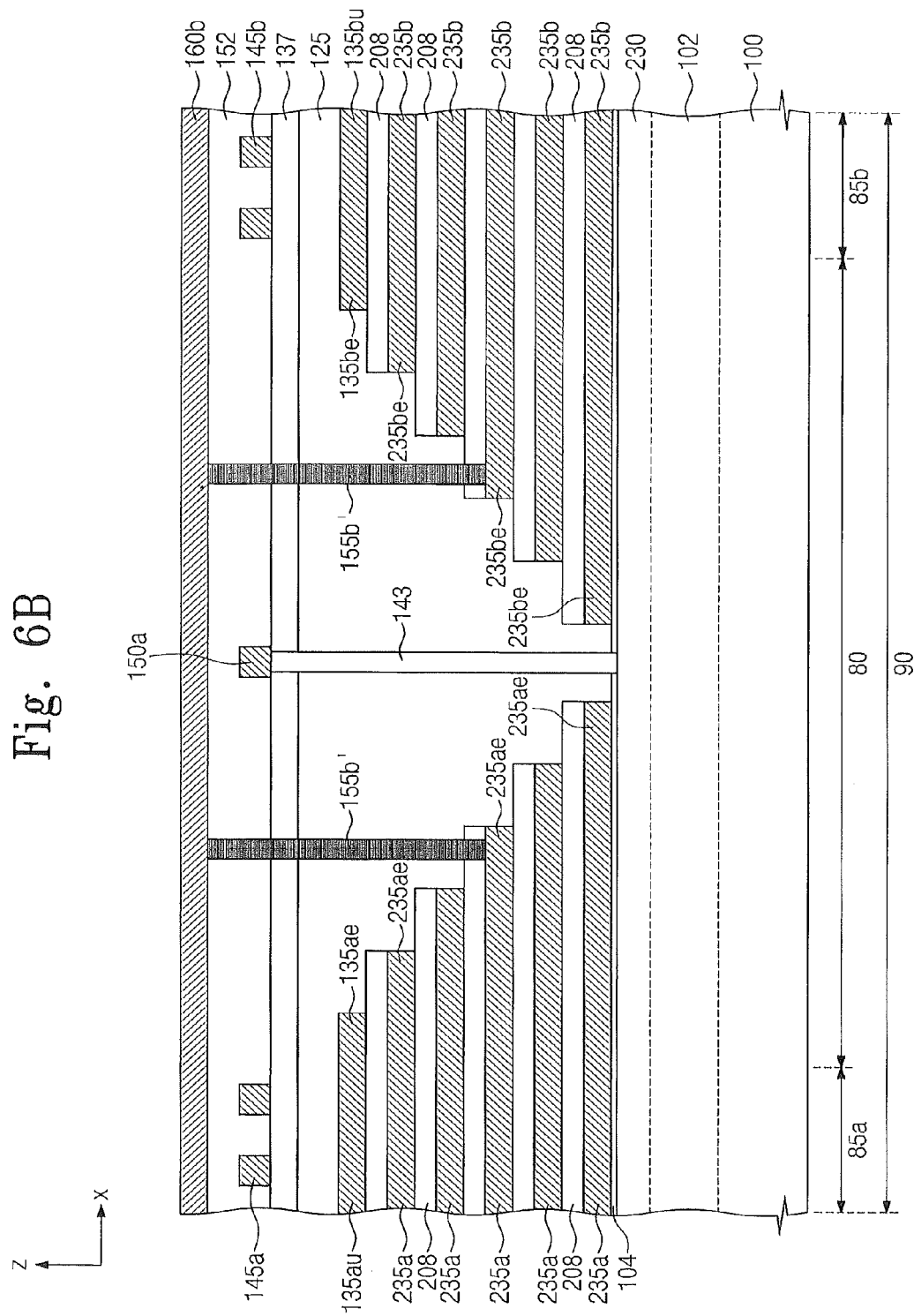
FIG. 6B is a sectional view taken along the line VI-VI' of FIG. 6A.

FIG. 6A is a perspective view illustrating still another modified example of the three-dimensional semiconductor memory device according to the first embodiment of the inventive concept; FIG. 6B is a sectional view taken along the line VI-VI' of FIG. 6A; and FIG. 6C is a sectional view taken along the line VII-VII' of FIG. 6A.

Figure 6C:
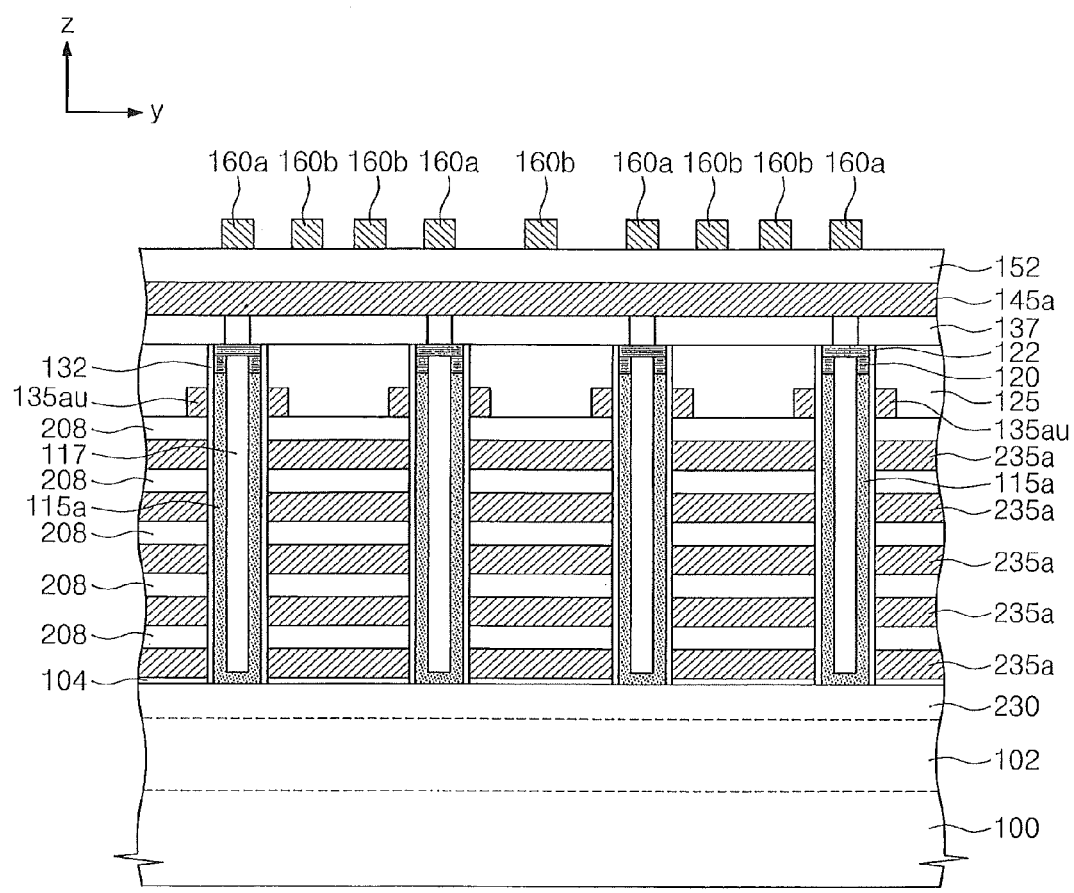
FIG. 6C is a sectional view taken along the line VII-VII' of FIG. 6A.

Referring to FIGS. 6A, 6B, and 6C, the uppermost sub-gates 135au and 135bu may have line shapes extending in the first direction as illustrated in FIGS. 1, 2A, and 3. A plurality of uppermost first sub-gates 135au may be arranged in parallel with each other in the first sub-cell region 85a. The uppermost first sub-gates 135au are spaced apart from each other in the second direction perpendicular to the first direction. Each of the uppermost first sub-gates 135au may have the extension 135ae extending into the strapping region 80. In drawings, the first direction may be x-axis, and the second direction may be y-axis. Similarly, a plurality of uppermost second sub-gates 135bu may be arranged in parallel with each other in the second sub-cell region 85b. The uppermost second sub-gates 135bu may be spaced apart from each other in the second direction. Each of the uppermost second sub-gates 135bu may have the extension 135be extending into the strapping region 80.

The first sub-gates, which are disposed below the uppermost first sub-gates 135au and located at the same level, extend laterally to be in contact with each other. For this reason, a first sub-gate 235a having one plate shape is disposed at each of floors. That is, the plate-shaped first sub-gates 235a may be sequentially stacked on the substrate 100 in the first sub-cell region 85a, and a plurality of the line-shaped uppermost first sub-gates 135au being located at the same level may be disposed on the plate-shaped first sub-gate 235a. Dielectric patterns 208 may be disposed between the stacked first sub-gates 235a and 135au. The dielectric patterns 208 may have a plate shape. Each of the plate-shaped first sub-gates 235a may have an extension 235ae extending into the strapping region 80. At this time, each of the plate-shaped first sub-gates 235a may have one extension 235ae. Each of the extensions 235ae may extend along the second direction in the strapping region 80.

Similarly, the second sub-gates, which are disposed below the uppermost second sub-gates 135bu and located at the same level, extend laterally to be in contact with each other. For this reason, a plate-shaped second sub-gate 235b is disposed at each of floors. Plate-shaped dielectric patterns 208 may be disposed between the stacked second sub-gates 235b and 135bu. Each of the plate-shaped second sub-gates 235b may have an extension 235be extending into the strapping region 80. The extension 235be of each of the plate-shaped second sub-gates 235b may extend along the second direction in the strapping region 80.

A capping insulation layer 125 may cover the extensions 135ae, 135be, 235ae, and 235be. In addition, the capping insulation layer 125 may extend into the first and second sub-cell regions 85a and 85b to cover the sub-gates 135au, 135bu, 235a, and 235b. The first vertical-type channel pillar 115a may successively penetrate the capping insulation layer 125, the stacked first sub-gates 235a and 135au, and the dielectric patterns 208 in the first sub-cell region 85a. The first vertical-type channel pillar 115a may come in contact with the substrate 100. The second vertical-type channel pillar 115b may successively penetrate the capping insulation layer 125, the stacked second sub-gates 235b and 135bu, and the dielectric patterns 208 in the second sub-cell region 85b. The second vertical-type channel pillar 115b may come in contact with the substrate 100.

The common source region 230 may be formed in the well region 102. The well region 102 is doped with a first-type dopant, and the common source region 230 is doped with a second-type dopant. The common source region 230 may be formed on the entire surface of the cell array region 90 in plan view. The first and second vertical-type channel pillars 115a and 115b may be connected to the common source region 230. Alternatively, the first and second vertical-type source region 115a and 115b penetrate the common source region 230 and may electrically be connected to the well region 90.

The first interlayer dielectric layer 137 may be disposed on the capping insulation layer 125. The first and second bitlines 145a and 145b may be disposed on the first interlayer dielectric layer 137. The first and second bitlines 145a and 145b are electrically connected to the top ends of the first and second vertical-type channel pillars 115a and 115b, respectively. Due to the extensions 235ae and 235be of the plate-shaped sub-gates 235a and 235b, the three-dimensional semiconductor memory device according to this modified example may not require the local interconnections 147a and 147b described in the three-dimensional semiconductor memory device of FIGS. 1, 2A, and 3.

The second interlayer dielectric layer 152 may be disposed on the entire surface of the substrate 100, and the first and second strapping lines 160a and 160b may be disposed on the second interlayer dielectric layer 152. Each of the first strapping lines 160a may electrically be connected to the uppermost first sub-gates 135au and 135bu via the first strapping contact pillars 115*a*, the conductive pads 146*a* and 146*b*, and the contact pillars 140*a* and 140*b*, as illustrated in FIGS. 1, 2A, and 3.

Since the local interconnections may be not required the local interconnections (147*a* and 147*b* in FIGS. 1, 2A and 3) due to shapes of the extensions 235*ae* and 235*be*, a second strapping contact pillar 155*b*' disposed below each of the strapping lines 160*b* may be connected to the extensions 235*ae* and 235*be* by successively penetrating the second and first interlayer dielectric layers 152 and 137 and the capping insulation layer 125.

The conductive line 150*a* may be disposed in the strapping region 80 and may extend in parallel with the bitlines 145*a* and 145*b*. The conductive line 150*a* may electrically be connected to the common source region 230, which is formed in the substrate 100 in the strapping region 80, through the contact pillar 143. The conductive line 150*a* may be located at the same level as the bitlines 145*a* and 145*b*.

Alternatively, the conductive line may electrically be connected to the well region 102 in the strapping region 80. This will be described with reference to FIG. 6D.

Figure 6D:
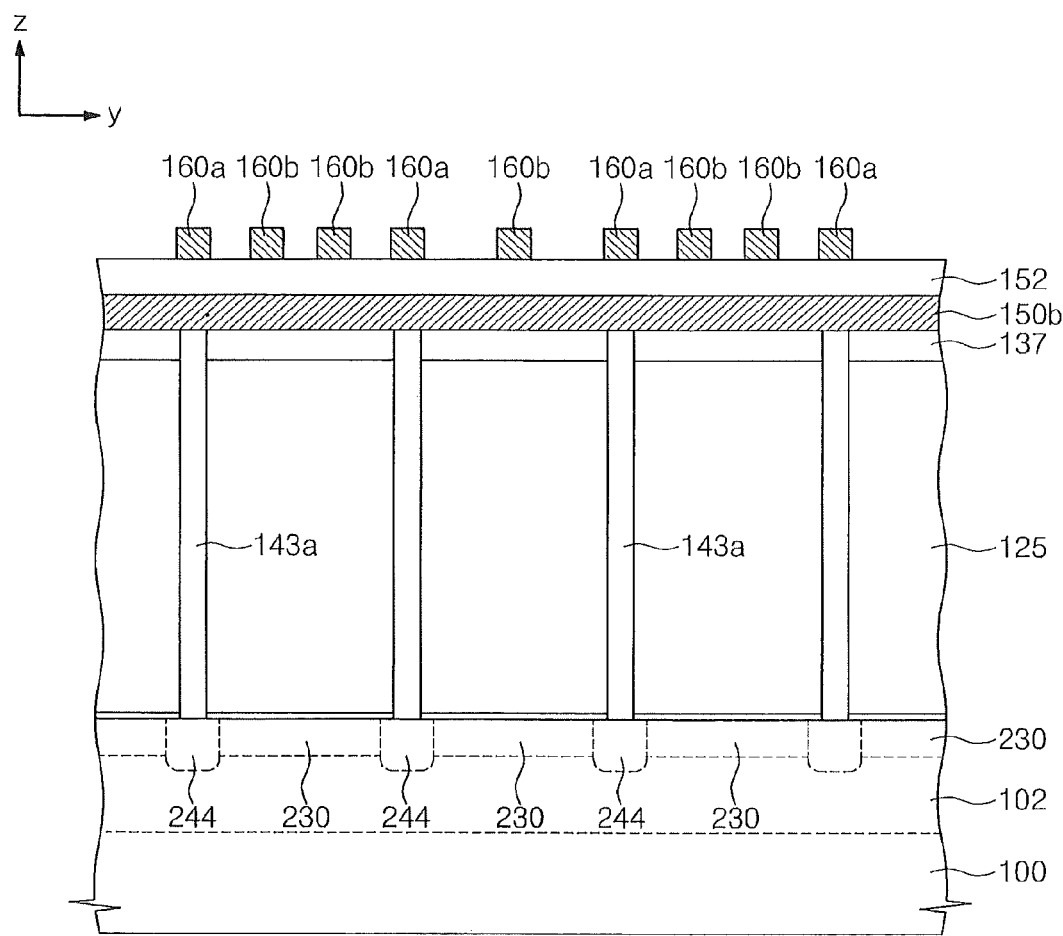
FIG. 6D is a sectional view taken along the line VIII-VIII' of FIG. 6A to explain a modified example of a conductive line electrically connected to a part of a top surface of a substrate in a strapping region included in the three-dimensional semiconductor memory device of FIG. 6A.

FIG. 6D is a sectional view taken along the line VIII-VIII' of FIG. 6A to explain a modified example of the conductive line electrically connected to a part of the top surface of the substrate in a strapping region included in the three-dimensional semiconductor memory device of FIG. 6A.

Referring to FIG. 6D, the conductive line 150*b* may electrically be connected to the well region 102 through the contact pillar 143*a* located therebelow. A well pickup region 244 is formed in the substrate 100 of the strapping region 80. The well pickup region 244 may come in contact with the well region 102 by penetrating the common source region 230. That is, the lower surface of the well pickup region 244 may be lower than that of the common source region 230. The well pickup region 244 is doped with the same dopant as the well region 102. The dopant concentration of the well pickup region 244 may be higher than that of the well region 102. The contact pillar 143*a* may come in contact with the well pickup region 244 by successively penetrating the first interlayer dielectric layer 137, the capping insulation layer 125, and the buffer dielectric layer 104.

FIGS. 7A, 8A, 9A, 10A and 11A are sectional views taken along I-I' of FIG. 1 to explain a method of forming the three-dimensional semiconductor memory device according to the first embodiment of the inventive concept, respectively; and FIGS. 7B, 8B, 9B, 10B and 11B are sectional views taken along III-III' of FIG. 1 to explain a method of forming the three-dimensional semiconductor memory device according to the first embodiment of the inventive concept, respectively.

Figure 7A:
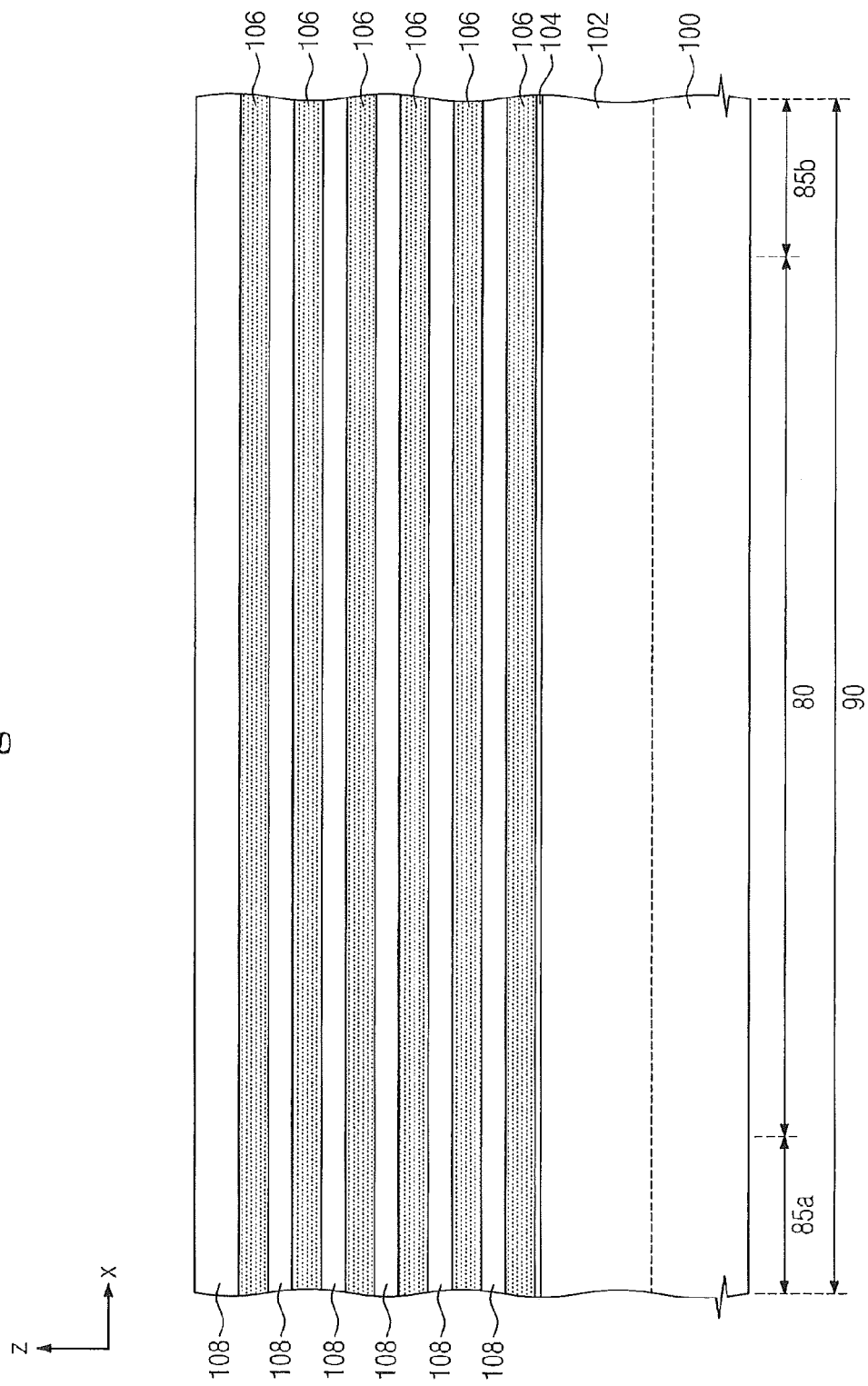
FIGS. 7A, 8A, 9A, 10A and 11A are sectional views taken along I-I' of FIG. 1 to explain a method of forming the three-dimensional semiconductor memory device according to the first embodiment of the inventive concept, respectively.
Figure 7B:
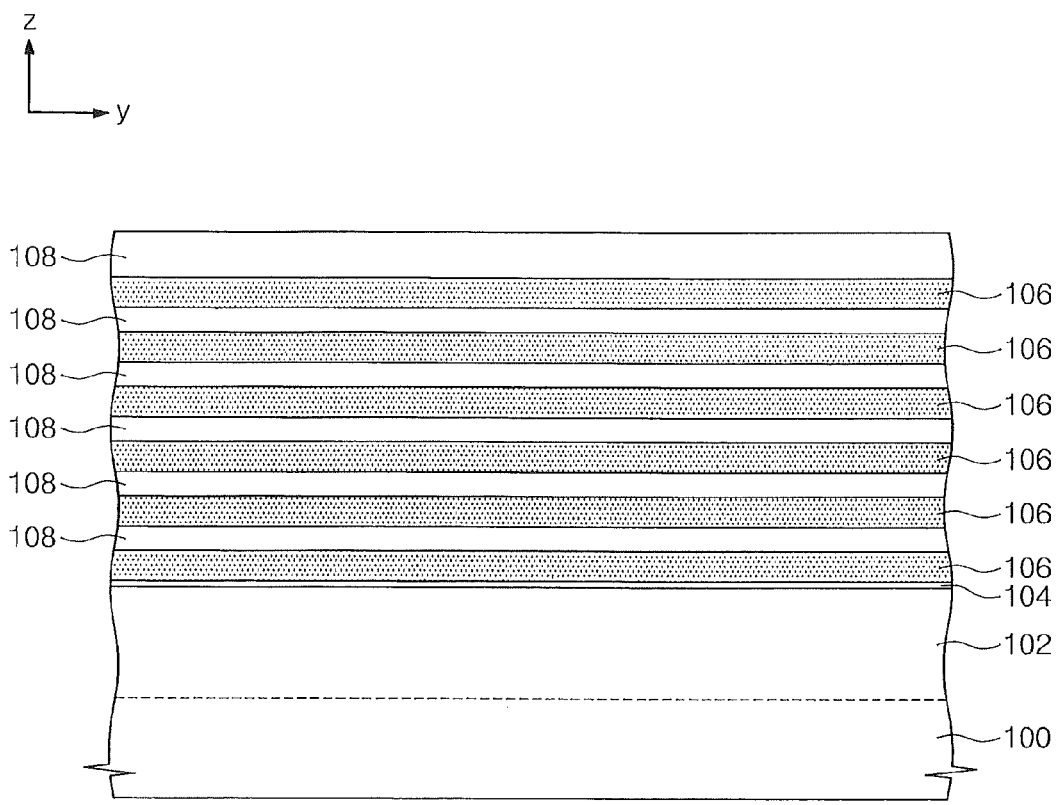
FIGS. 7B, 8B, 9B, 10B and 11B are sectional views taken along III-III' of FIG. 1 to explain a method of forming the three-dimensional semiconductor memory device according to the first embodiment of the inventive concept, respectively.

Referring to FIGS. 7A and 7B, the substrate 100 having the cell array region 90 may be prepared. The cell array region 90 may include a first sub-cell region 85*a*, a strapping region 80, and a second sub-cell region 85*b*. A well region 102 may be formed by supplying the first-type dopant into the substrate 100 of the cell array region 90. The well region 102 may be formed by dopant-ion implantation process. The well region 102 may be formed on the entire surface of the cell array region 90 in plan view.

A buffer dielectric layer 104 may be formed on the substrate 100 having the well region 102. Sacrificial layers 106 and dielectric layers 108 may be alternately and repeatedly formed on the buffer dielectric layer 104. The dielectric layers 108 may be formed of dielectric materials having an etch selectivity with respect to the sacrificial layers 106. Further, the buffer dielectric layer 104 may also be formed of dielectric materials having an etch selectivity with respect to the sacrificial layers 106. For instance, the buffer dielectric layer 104 may be formed of oxide (ex., thermal oxide, etc). The dielectric layers 108 may be formed of oxide (ex., CVD oxide, etc). In this case, the sacrificial layers 106 may be formed of, for example, nitride and/or oxynitride. In the structure of the alternately stacked sacrificial layers 106 and dielectric layers 108, the uppermost layer may be the dielectric layer 108. The uppermost dielectric layer in the dielectric layers 108 may be formed thicker than the dielectric layer therebelow.

Figure 8A:
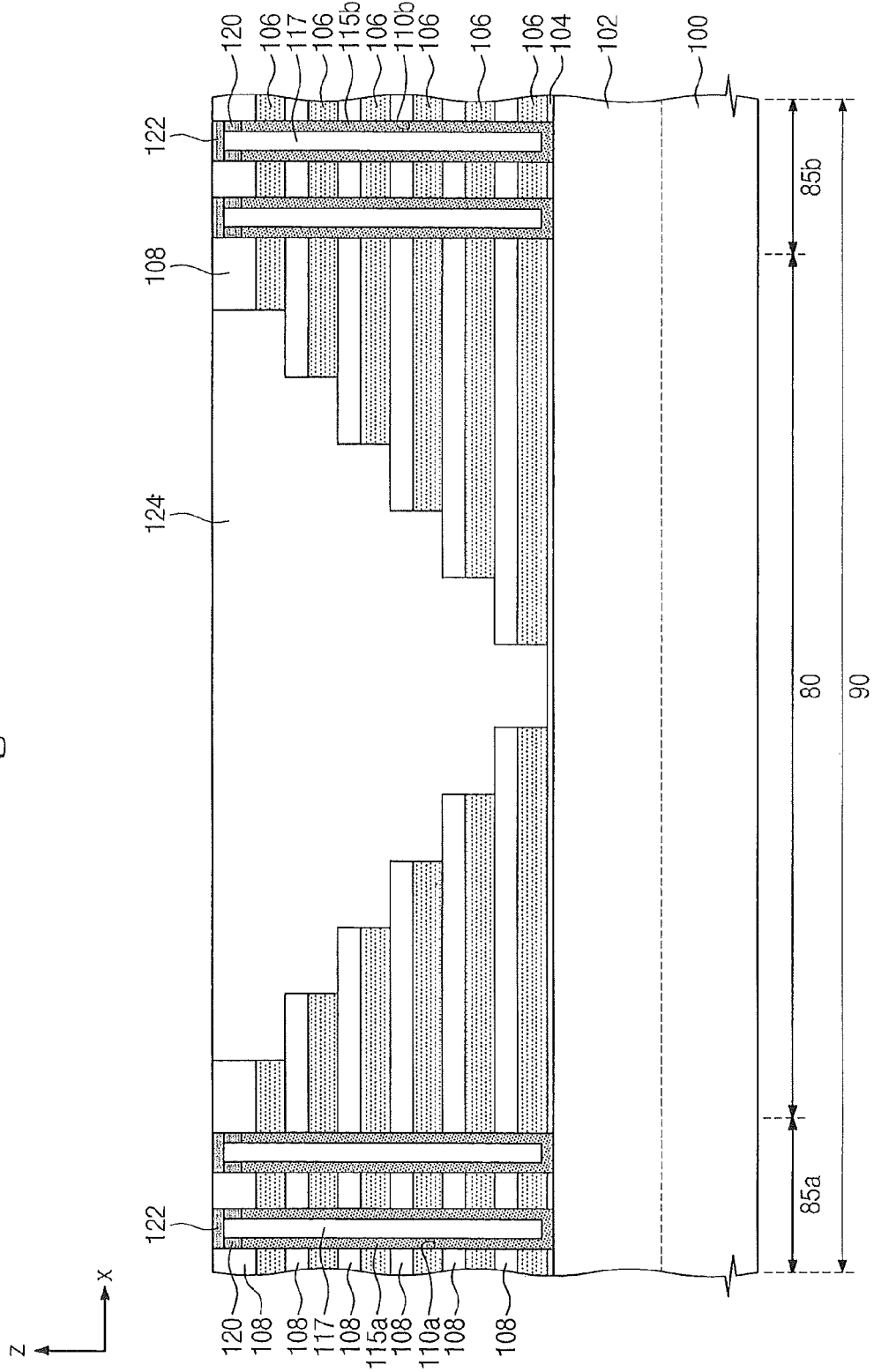
Figure 8B:
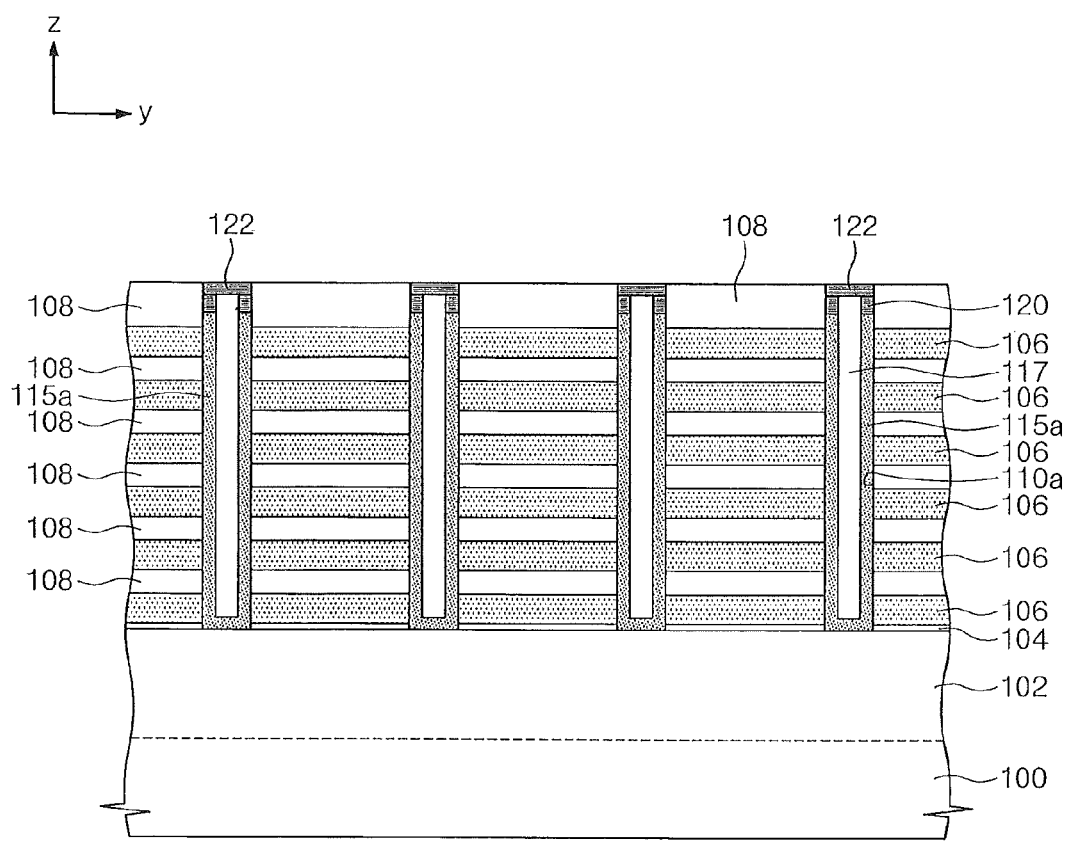

Referring to FIGS. 8A and 8B, channel holes 110*a* and 110*b* may be formed by successively patterning the dielectric layers 108, the sacrificial layers 106, and the buffer dielectric layer 104 to expose the substrate 100. First channel hole 110*a* may be provided in a plural number within the first sub-cell region 85*a*, and second channel hole 110*b* may be provided in a plural number within the second sub-cell region 85*b*.

A channel semiconductor layer may conformally be formed on the substrate 100 having the first and second channel holes 110*a* and 110*b*. A filling dielectric layer may be formed on the channel semiconductor layer to fill the first and second channel holes 110*a* and 110*b*. Subsequently, the filling dielectric and the channel semiconductor layer may be planarized until the uppermost dielectric layer is exposed. As a result, the first vertical-type channel pattern 115*a* and the filling dielectric pattern 117 may be formed in the first channel hole 110*a*, and the second vertical-type channel pattern 115*b* and the filling dielectric pattern 117 may be formed in the second channel hole 110*b*. The top ends of the first and second vertical-type channel patterns 115*a* and 115*b* may be recessed lower than the uppermost dielectric layer 108. Then, the capping semiconductor patterns 122 may be formed in the channel holes 110*a* and 110*b*, respectively.

Drain regions 120 may be formed by implanting the second-type dopant ions into the top parts of the first and second vertical-type channel patterns 115*a* and 115*b*. At this time, the second-type dopant ions may also be implanted into the capping semiconductor patterns 122.

According to one embodiment of the inventive concept, the channel semiconductor layer may be formed to fill the channel holes 110*a* and 110*b*. In this case, the filling dielectric layer may be not required, and the first and second vertical-type channel patterns 115*a* and 115*b* may be formed to have a pillar shape.

The dielectric layers 108 and the sacrificial layers 106 within the strapping region 80 may be patterned to form the terraced structure. The dielectric layers 108 and the sacrificial layers 106 having the terraced structure may be formed to have a plate shape in plan view. One method of forming the dielectric layers 108 and the sacrificial layers 106 having the terraced structure will now be described. A mask pattern having an opening may be formed on the uppermost dielectric layer within the strapping region 80. The uppermost dielectric layer and the uppermost sacrificial layer may be etched using the mask pattern as an etching mask. This may allow the dielectric layer directly below the uppermost dielectric layer to be exposed. Subsequently, the width of the opening may be widened by isotropically etching the mask pattern. Due to the widened opening, the uppermost dielectric layer and the dielectric layer directly below the uppermost dielectric layer may be exposed. Then, the uppermost dielectric layer, and the uppermost sacrificial layer and the dielectric layer and the sacrificial layer directly therebelow may be etched by using the isotropically etched mask pattern as an etching mask. By repeatedly performing the isotropic etching of these mask patterns and the etching of the dielectric layer and the sacrificial layer, the dielectric layers 108 and the sacrificial layers 106 may be formed to have the terraced structure. However, the inventive concept is not limited thereto. The dielectric layers 108 and the sacrificial layers 106 within the strapping region 80 may be formed by other ways to have the terraced structure.

A capping insulation layer 124 may be formed in the strapping region 80 to cover the dielectric layers 108 and the sacrificial layers 106 having the terraced structure. The capping insulation layer 124 may be formed of dielectric materials having the etch selectivity with respect to the sacrificial layers 106. For instance, the capping insulation layer 124 may be formed of the same material as the dielectric layers 108. That is, the capping insulation layer 124 may also be formed of oxide. After the capping insulation layer 124 is deposited, an upper surface thereof may be planarized. The capping insulation layer 124 may be planarized using the capping semiconductor pattern 122 as an etch stop layer.

According to one embodiment of the inventive concept, after the vertical-type channel patterns 115a and 115b are formed, the dielectric layers 108 and the sacrificial layers 106 within the strapping region 80 may be formed to have the terraced structure. Alternatively, after the dielectric layers 108 and the sacrificial layers 106 within the strapping region 80 are formed to have the terraced structure and the capping insulation layer 124 is formed, the vertical-type channel patterns 115a and 115b may be formed.

Figure 9A:
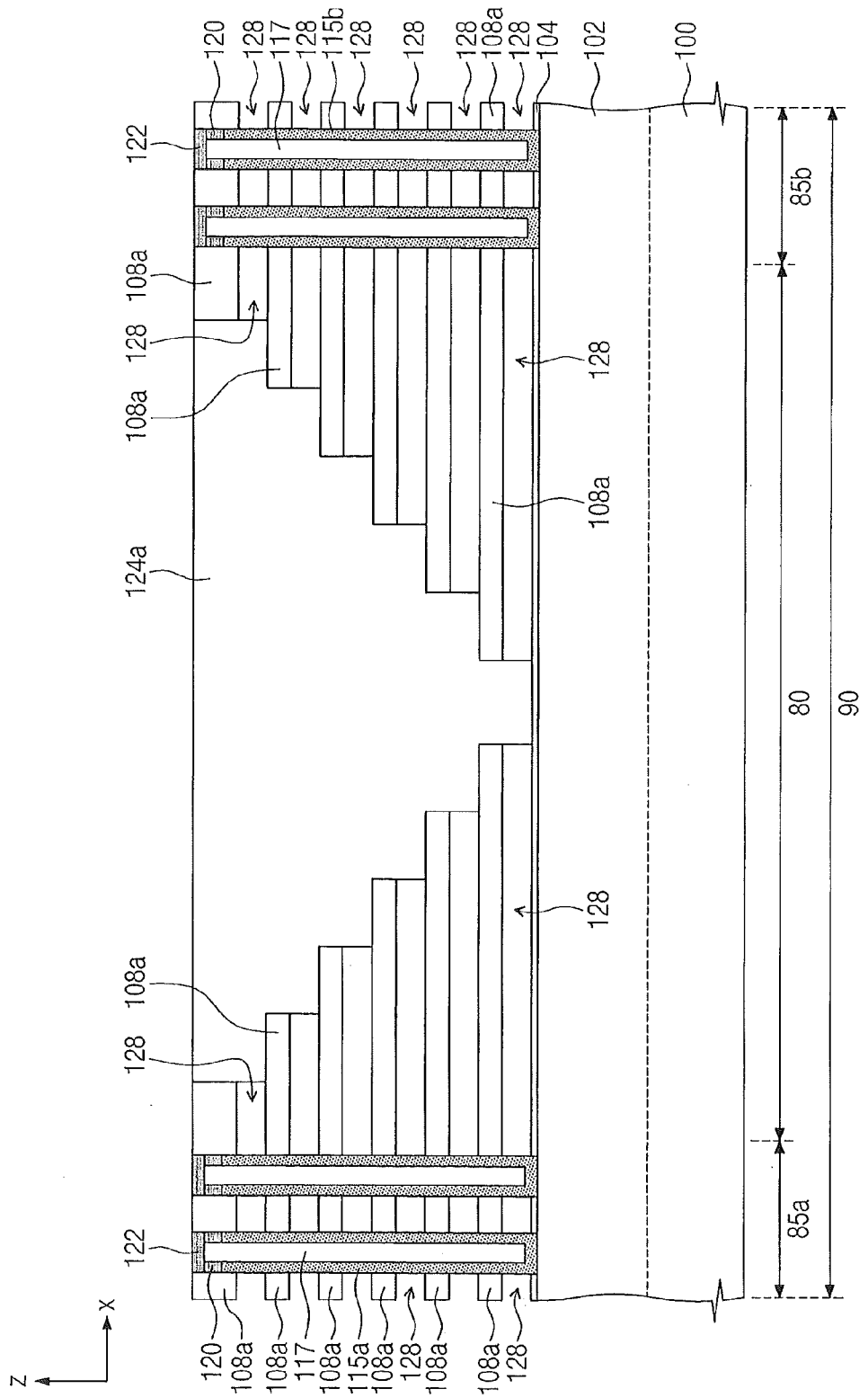
Figure 9B:
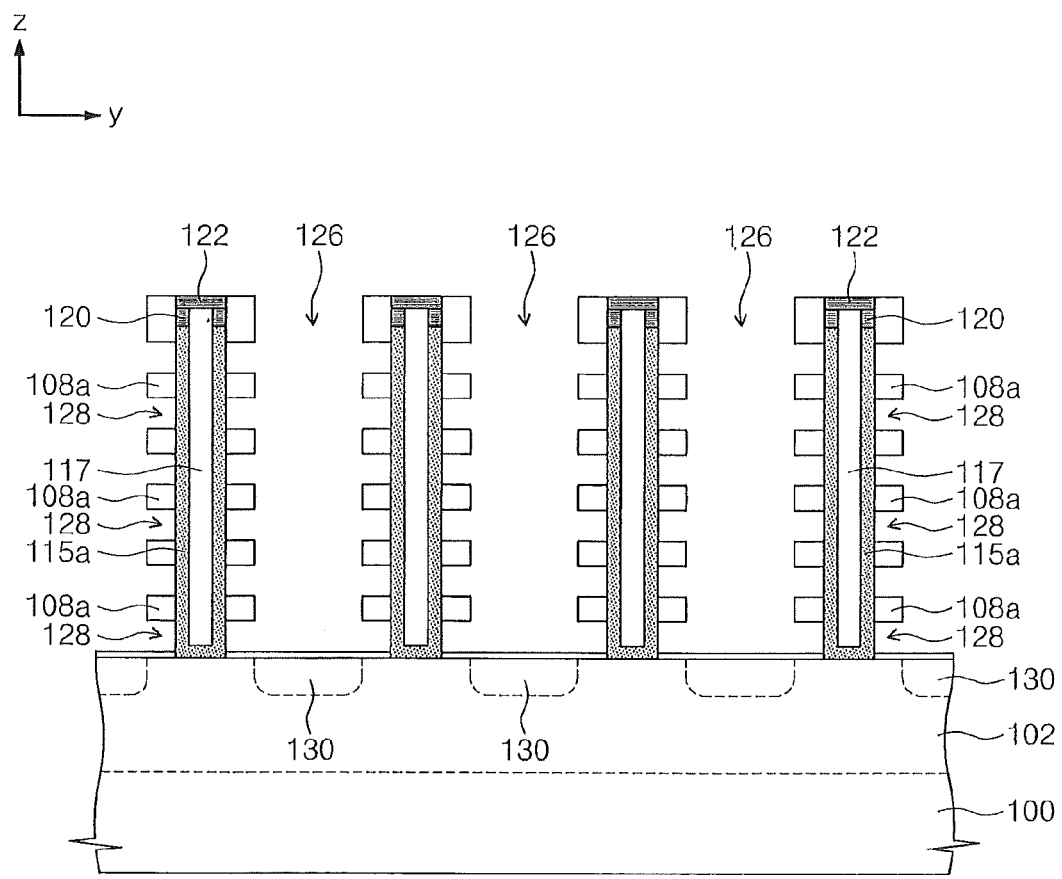

Referring to FIGS. 9A and 9B, grooves 126 may be formed so as to be spaced apart from each other and be arranged in parallel with each other by successively patterning the dielectric layers 108 and the sacrificial layers 106, as illustrated in FIG. 9B. At this time, the capping insulation layer 124, the dielectric layers 108, and the sacrificial layers 106 may successively be patterned in the strapping region 80. Each of the grooves 126 may extend so as to be successively disposed in the first sub-cell region 85a, the strapping region 80, and the second sub-cell region 85b. The dielectric patterns 108a are formed by forming the grooves 126, and the patterned sacrificial layers 106 may be exposed by inner sidewalls of the grooves 126.

Subsequently, the sacrificial layers 106 exposed in the grooves 126 are removed, thereby forming empty regions 128. Each of the empty regions 128 may be a region in which the sacrificial layers 106 are removed. Parts of the sidewalls of the vertical-type channel patterns 110a and 110b are exposed by the empty regions 128. Since the sacrificial layers 106 are formed to have the terraced structure in the strapping region 80, each of the empty regions 128 within the first sub-cell region 85a may have an extension extending into the strapping region 80. In addition, each of the empty regions 128 within the second sub-cell region 85b may have an extension extending into the strapping region 80.

Figure 10A:
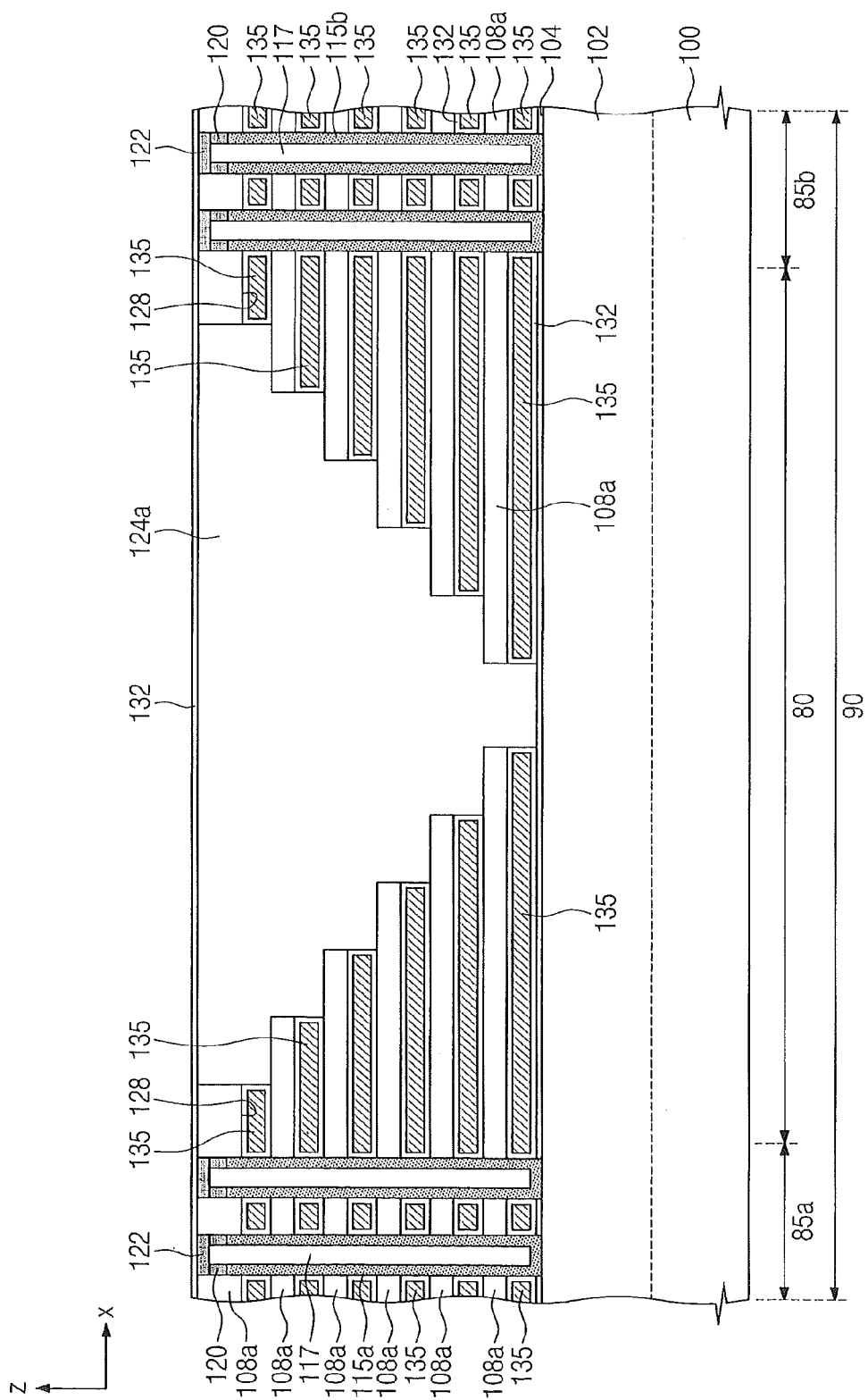
Figure 10B:
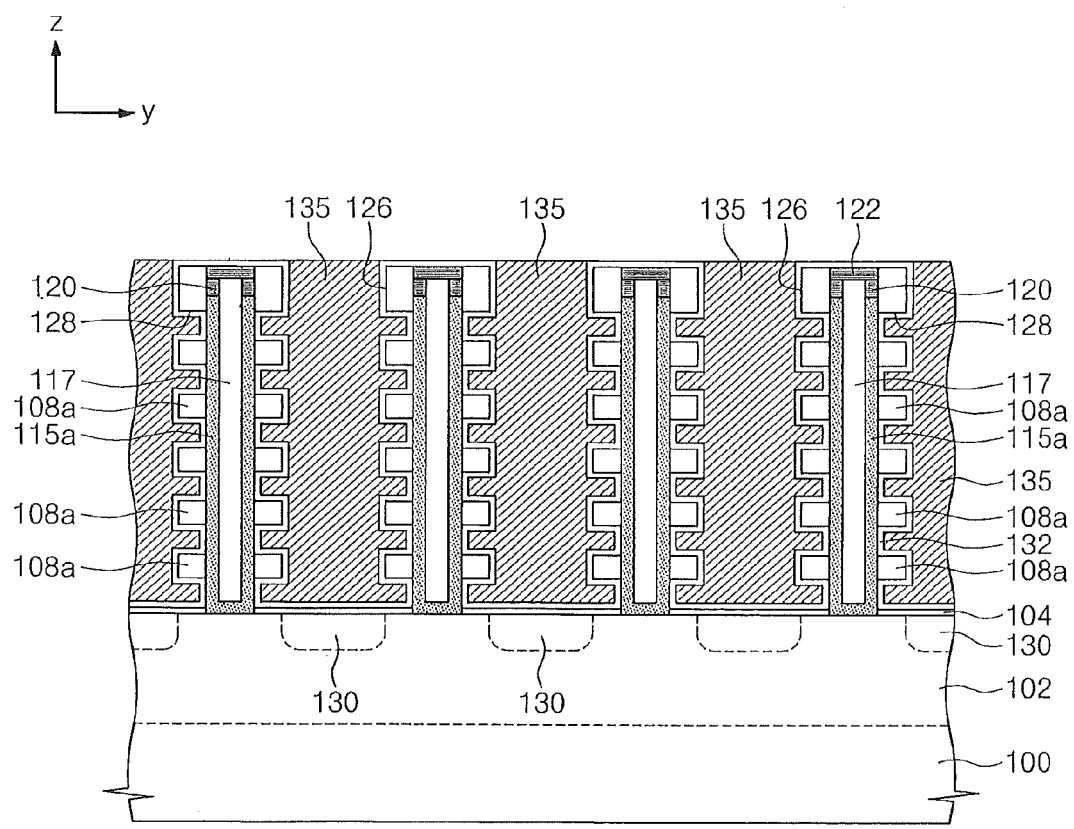

Referring to FIGS. 10A and 10B, a data storage layer 132 may be conformally formed on the substrate 100 having the empty regions 128. A tunnel dielectric layer in the data storage layer 132 may include a thermal oxide layer formed by performing a thermal oxidation process on the vertical-type channel patterns 110a and 110b exposed by the empty regions 128. Alternatively, the tunnel dielectric layer in the data storage layer 132 may include an oxide layer formed by atomic layer deposition. A charge storage layer and a blocking dielectric layer included in the data storage layer 132 may be formed by, for example, the atomic layer deposition and/or chemical vapor deposition having good step coverage.

A gate conductive layer 135 may be formed on the data storage layer 132 to fill the empty regions 128. The gate conductive layer 135, as illustrated in FIG. 10B, may fill the grooves 126. The gate conductive layer 135 may be planarized until the data storage layer 132 disposed on the uppermost dielectric pattern is exposed. According to one embodiment of the inventive concept, the data storage layer 132 exposed on the uppermost dielectric pattern 108a may be etched until the uppermost dielectric pattern 108a is exposed. According to one embodiment of the inventive concept, the gate conductive layer 135 completely fills the empty regions 128, but may partially fill the grooves 126.

Figure 11A:
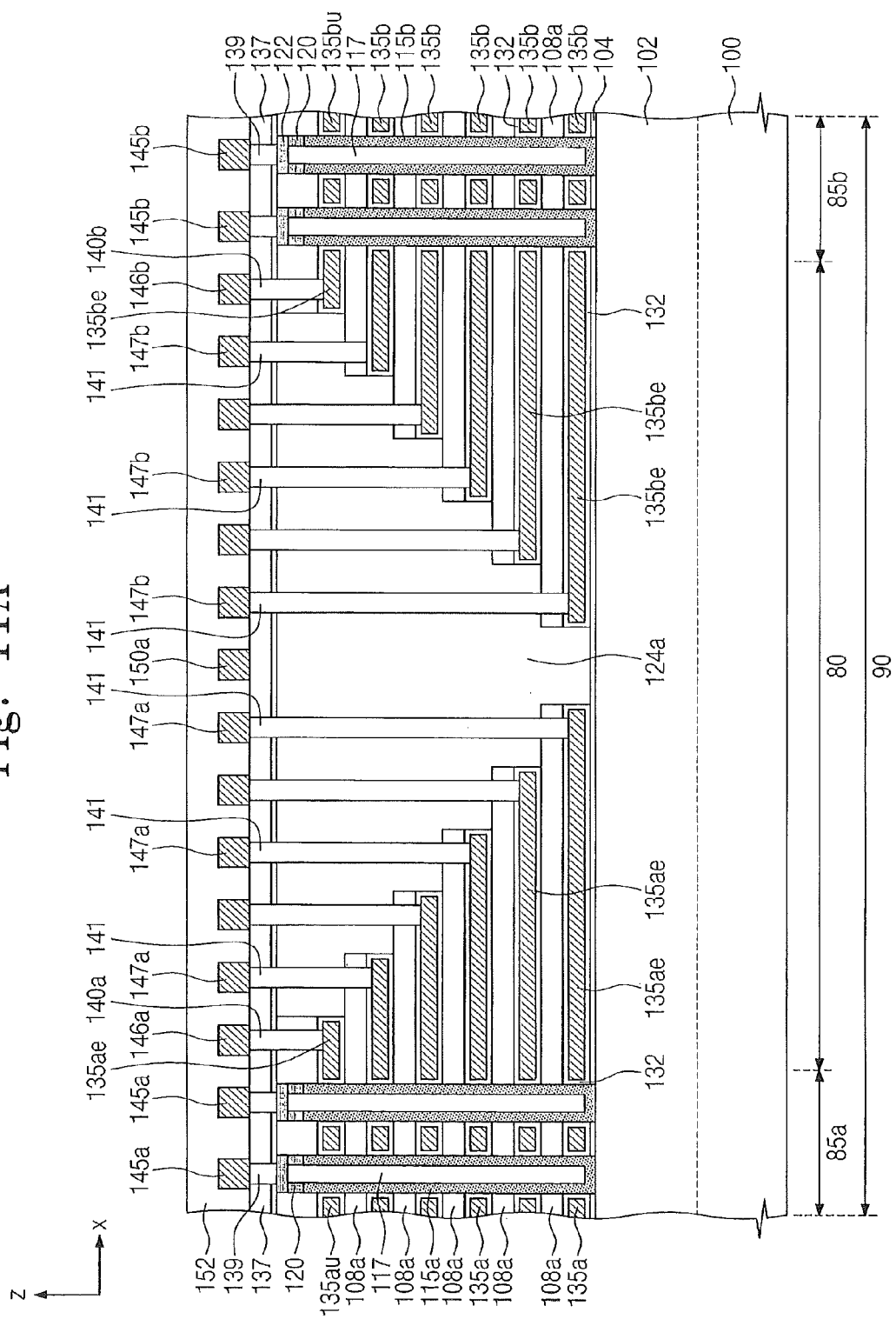
Figure 11B:
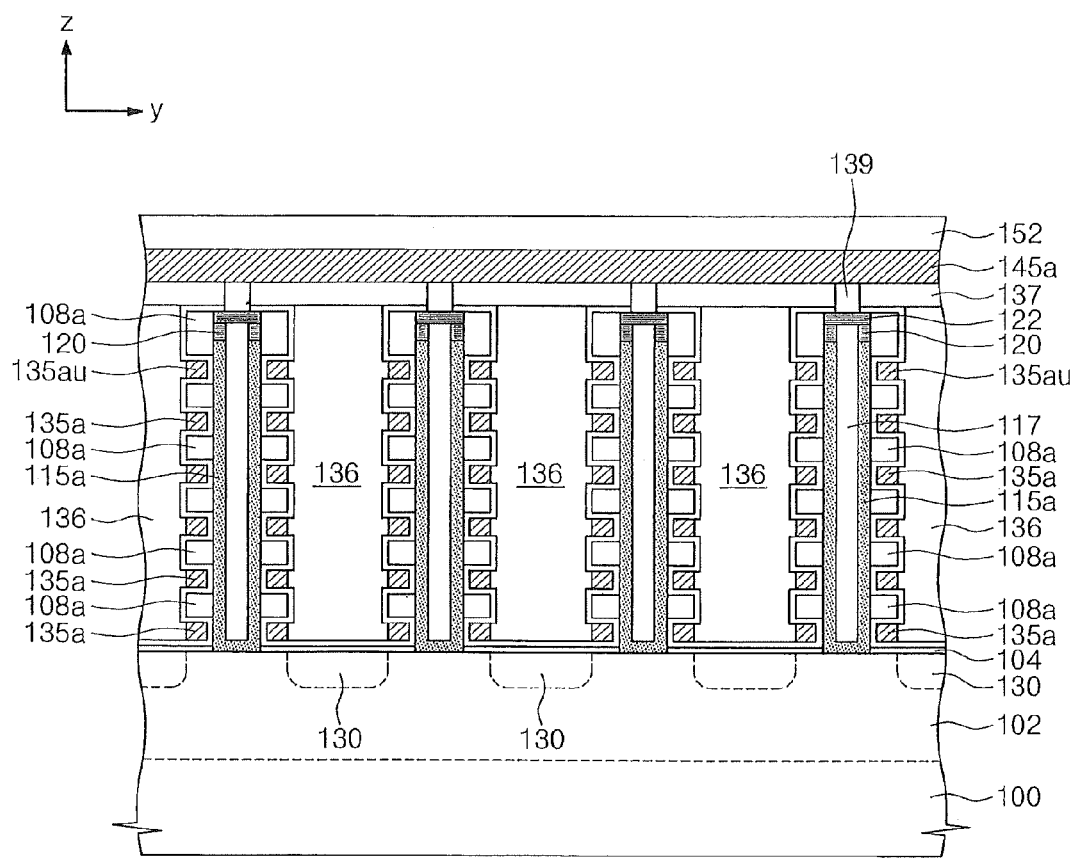

Referring to FIGS. 11A and 11B, the gate conductive layer located outside the empty regions 128 is removed. Therefore, the sub-gates 135a, 135au, 135b, and 135bu may be formed in the empty regions 128. Since the empty regions 128 have the extensions extending into the strapping region 80, each of stacked first sub-gates 135a and 135au has an extension extending into the strapping region 80. Also, each of stacked second sub-gates 135b and 135bu has an extension extending into the strapping region 80.

Subsequently, a device isolation pattern 136 may be formed to fill each of the grooves 126 illustrated in FIG. 11B. A first interlayer dielectric layer 137 may be formed on the substrate 100 having the device isolation patterns 136. Then, contact pillars 139, 140a, 140b, 141 and 143 may be formed. The bitlines 145a 145b, the conductive pads 146a and 146b, and the local interconnections 147a and 147b, which are described with reference to FIGS. 1, 2A through 2E, and 3, may be formed on the first interlayer dielectric layer 137. A second interlayer dielectric layer 152 may be formed on the bitlines 145a 145b, the conductive pads 146a and 146b, and the local interconnections 147a and 147b.

Subsequently, the strapping contact pillars 155a and 155b and the strapping lines 160a and 160b, which are described with reference to FIGS. 1, 2A through 2E, and 3, may be formed. Therefore, it is possible to realize the three-dimensional semiconductor memory device described with reference to FIGS. 1, 2A through 2E, and 3.

The semiconductor memory devices illustrated in FIGS. 4A through 4D and 5 may be realized by modifying the shape and/or location of the conductive pads 146a and 146b, the strapping contact pillars 155a and 155b, and the strapping lines 160a and 160b, respectively.

Meanwhile, a method of forming the three-dimensional semiconductor memory device illustrate in FIGS. 6A through 6C will briefly be described with reference to FIGS. 6A through 6C.

Referring to FIGS. 6A through 6C, the well region 102 may be formed in the substrate 100, and the common source region 230 may be formed in the well region 102. The buffer dielectric layer 104 may be formed on the substrate 100. Gate conductive layers and dielectric layers may be alternately and repeatedly formed on the buffer dielectric layer 104, the gate conductive layers and dielectric layers within the strapping region 80 may be patterned to be formed of a terraced structure. At this time, plate-shaped first sub-gates 235a may be formed on the first sub-cell region 85a, and plate-shaped second sub-gates 235b may be formed on the second sub-cell region 85b. At this time, the uppermost gate conductive patterns being disposed over the tops of the first and second sub-cell regions 85a and 85b are not included in the plate-shaped first and second sub-gates 235a and 235b. The uppermost gate conductive patterns may be patterned, thereby forming a plurality of uppermost first sub-gates 135au and uppermost second sub-gates 135bu. Subsequently, a capping insulation layer 125 may be formed, and then channel holes may be formed in the first sub-gates 135a and 135au and in the second sub-gates 135b and 135bu. A data storage layer 132 may be formed in the channel holes. Then, the data storage layer 132 on the bottoms of the channel holes may be removed. And then first and second vertical-type channel patterns 115a and 115b may be formed in the channel holes.

Subsequently, the first interlayer dielectric layer 137, the bitlines 145 and 145b, the conductive lien 150a, the second interlayer dielectric layer 152, and the strapping lines 160a and 160b may be formed in a similar manner as described with reference to FIGS. 11A and 11B. As a result, it is possible to realize the three-dimensional semiconductor memory device illustrate in FIGS. 6A through 6C.

Second Embodiment

The same reference numerals may be denoted to the same components as in the above first embodiment of the inventive concept, and the description thereof will be omitted hereinafter for brevity.

Figure 12:
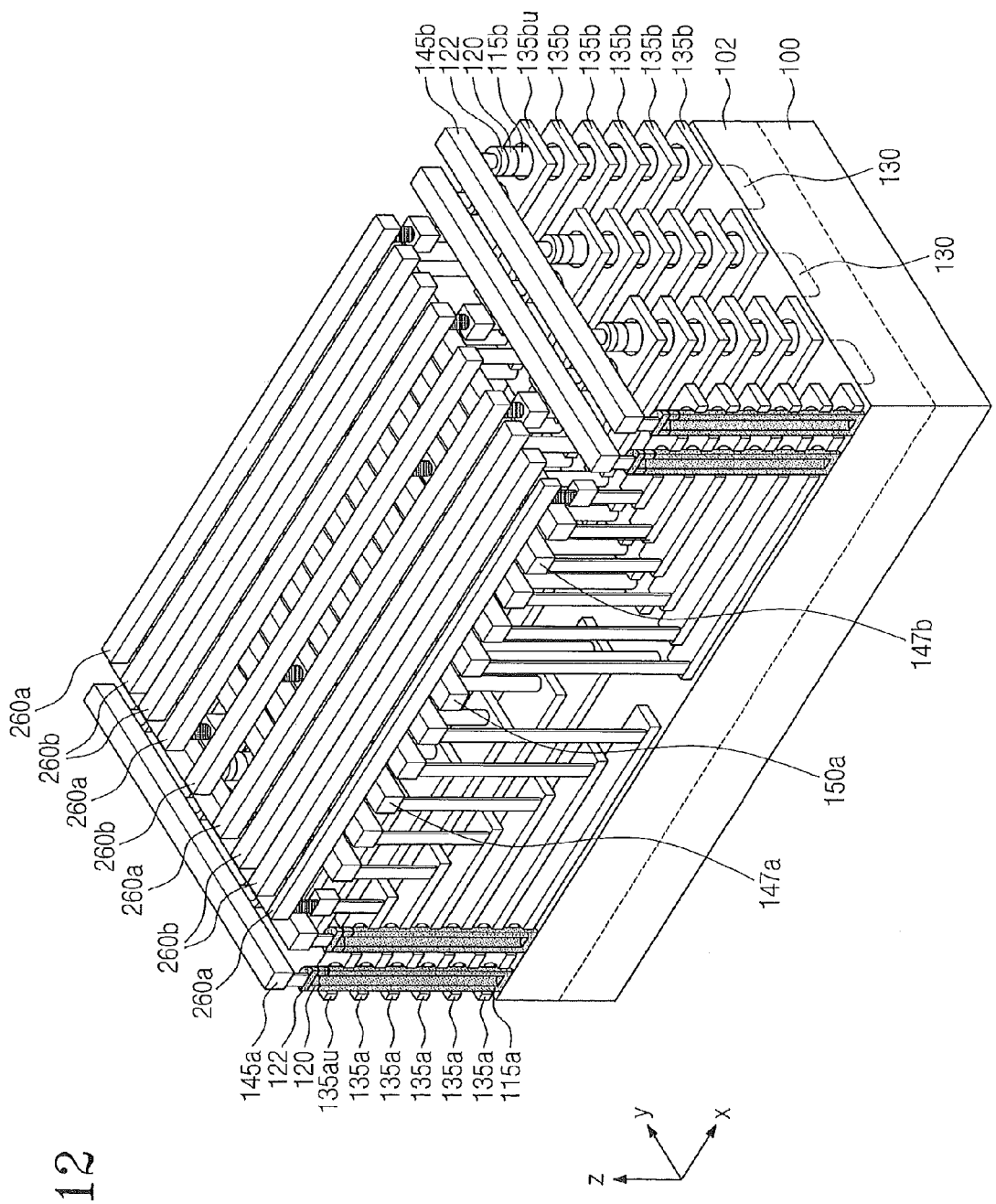
FIG. 12 is a perspective view illustrating a three-dimensional semiconductor memory device according to a second embodiment of the inventive concept.
Figure 13:
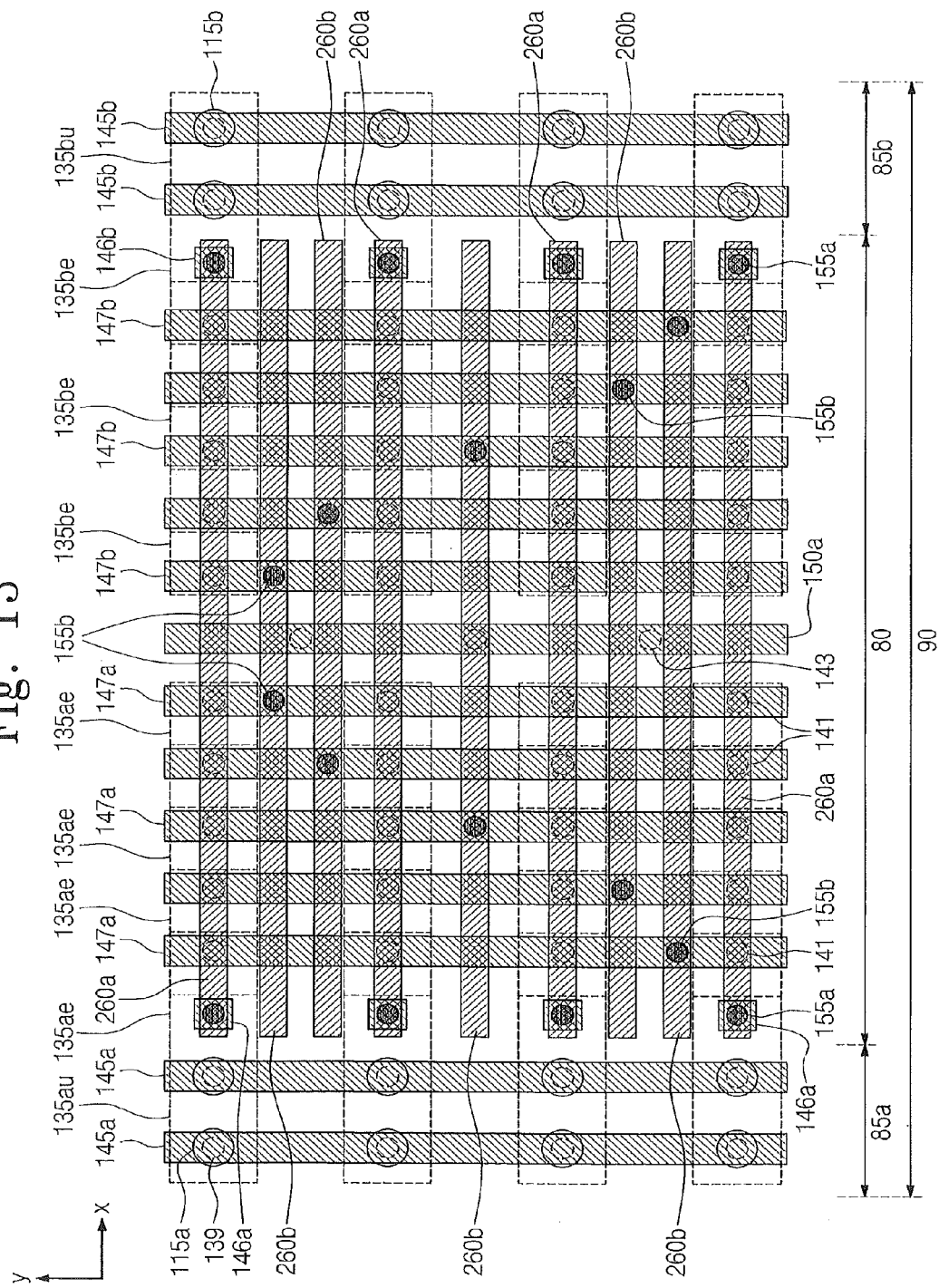
FIG. 13 is a plan view of the three-dimensional semiconductor memory device illustrated in FIG. 12.
Figure 14:
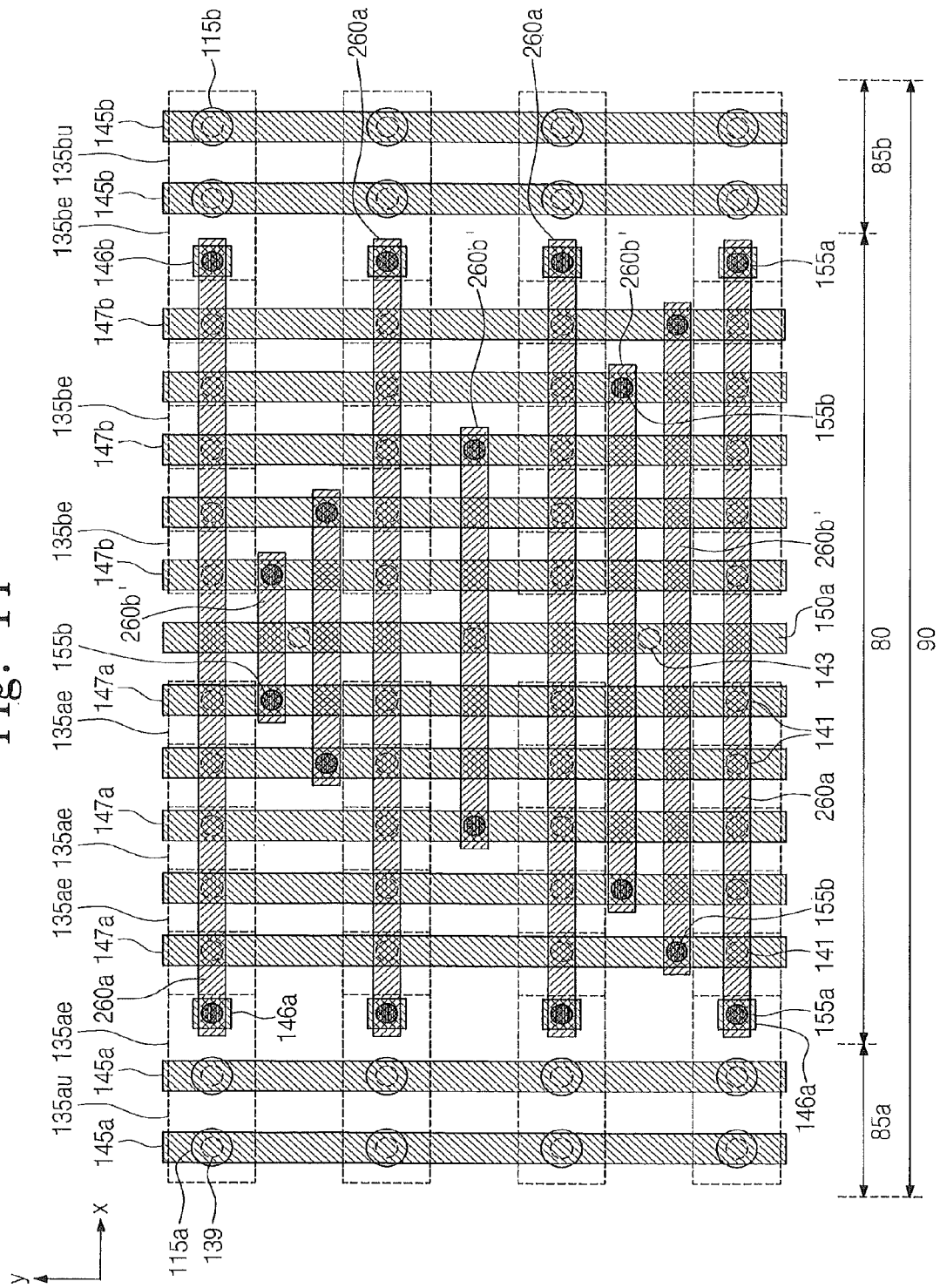
FIG. 14 is a plan view illustrating one modified example of the three-dimensional semiconductor memory device according to the second embodiment of the inventive concept.

FIG. 12 is a perspective view illustrating a three-dimensional semiconductor memory device according to the second embodiment of the inventive concept; FIG. 13 is a plan view of the three-dimensional semiconductor memory device illustrated in FIG. 12; and FIG. 14 is a plan view illustrating one modified example of the three-dimensional semiconductor memory device according to the second embodiment of the inventive concept.

Referring to FIGS. 12 and 13, the three-dimensional semiconductor memory device may include the vertical-type string groups, the conductive line 150a, the bitlines 145a and 145b, the local interconnections 147a and 147b, and the second interlayer dielectric layer 152, which are described with reference to FIGS. 1, 2A through 2E, and 3. A plurality of interconnections 260a and 260b may be disposed in the strapping region 80. The interconnections 260a and 260b may be formed of the same material as the strapping lines 160a and 160b described with reference to FIGS. 1 and 3. The interconnections 260a and 260b may be located at the same level.

The interconnections 260a and 260b may be string interconnections 260a and level interconnections 260b. Each of the string interconnections 260a may be electrically connected to the extensions 135ae and 135be of the uppermost first and second sub-gates 135au and 135bu within each of the vertical-type string groups by means of the contact pillars 155a. Each of the level interconnections 260b may be electrically connected to the extensions 135ae and 135be of the first and second sub-gates 135a and 135b being disposed below the uppermost first and second sub-gates 135au and 135bu and being located at the same level. Each of the level interconnections 260b may be electrically connected to the extensions 135ae and 135be of the sub-gates 135a and 135b located at the same level by means of the contact pillars 155b, the first local interconnection 147a, and the second local interconnection 14711

The first sub-gates 135a and 135au of the first sub-cell region 85a may electrically be connected to the second sub-gates 135b and 135bu of the second sub-cell region 85b, respectively, due to the interconnections 260a and 260b disposed in the strapping region 80. As described above, the conductive line 150a may be disposed in the strapping region 80. The conductive line 150a may be electrically connected to the common source regions 130. Accordingly, the three-dimensional semiconductor memory device according to this embodiment of the inventive concept may include the conductive line 150a for strapping the common source regions 130 disposed in the strapping region 80 and the interconnections 260a and 260b for making the electrical connection between the first and second sub-gates.

In the three-dimensional semiconductor memory device illustrated in FIGS. 12 and 13, the conductive line 150a may be substituted by the conductive line 150b electrically connected to the well region 102 illustrated in FIG. 2F.

The interconnections 260a and 260b may extend in parallel with each other in the first direction, and the conductive line 150a may extend in the second direction perpendicular to the first direction. The interconnections 260a and 260b may cross over the conductive line 150a. That is, the interconnections 260a and 260b may be disposed higher than the conductive line 150a. As illustrated in FIGS. 12 and 13, the interconnections 260a and 260b may have the same length in the first direction.

Alternatively, as illustrated in FIG. 14, the string interconnections 260a may have the same length in the first direction, whereas the level interconnections 260b' may have lengths different from each other in the first direction.

According to the second embodiment of the inventive concept, the three-dimensional semiconductor memory device may include both the conductive line for strapping the common source region into the cell array region and the conductive line for making the pickup of the well region. This will be described with reference to drawings.

Figure 15:
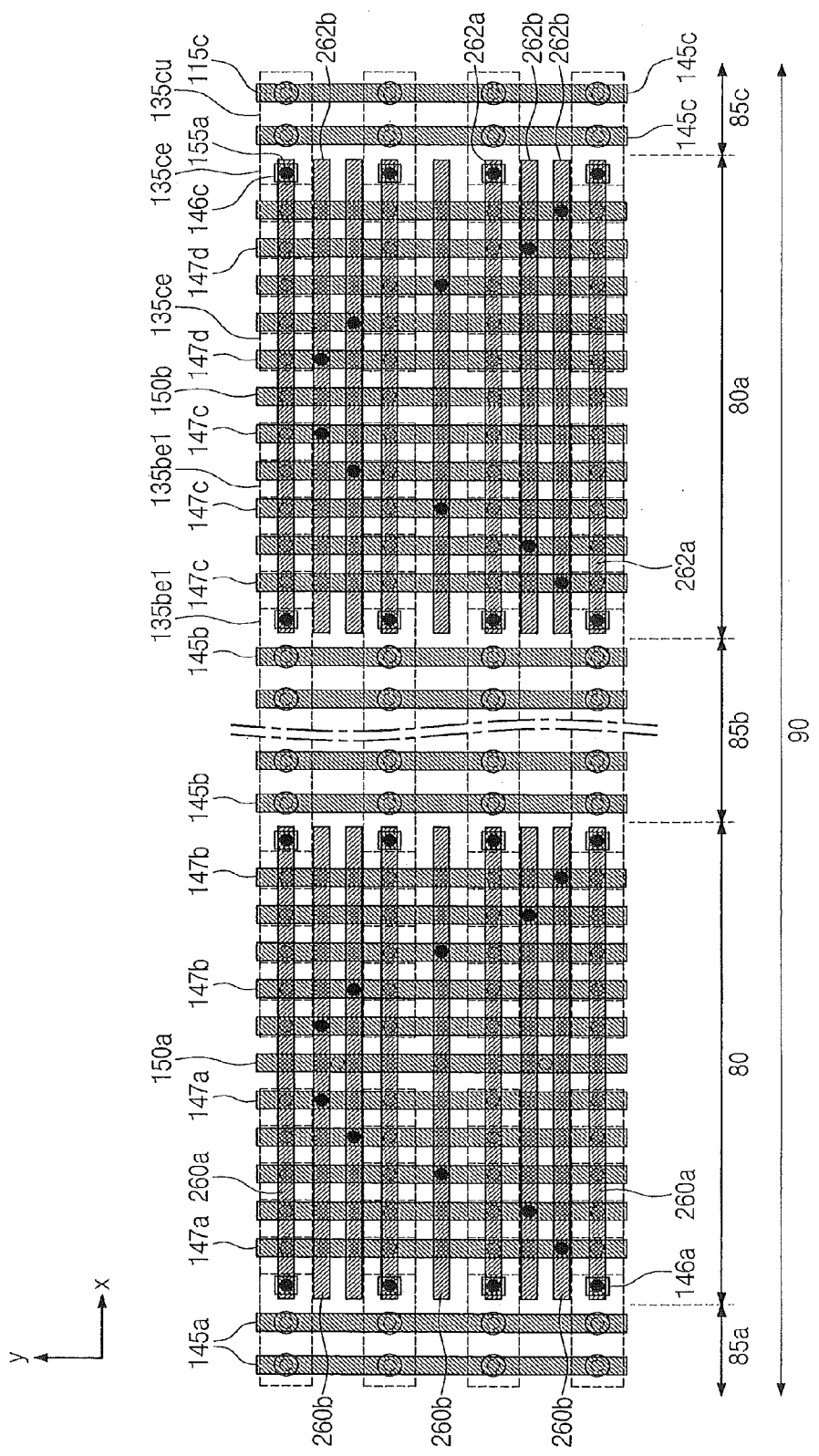
FIG. 15 is a plan view illustrating another modified example of the three-dimensional semiconductor memory device according to the second embodiment of the inventive concept.

FIG. 15 is a plan view illustrating another modified example of the three-dimensional semiconductor memory device according to the second embodiment of the inventive concept.

Referring to FIG. 15, the three-dimensional semiconductor memory device according to this modified example may include the cell array region 90 having the first, second, and third sub-cell regions 85a, 85b, and 85c and the first and second strapping regions 80 and 80a, which are illustrated in FIG. 4D. In addition, the three-dimensional semiconductor memory device according to this modified example may include the first, second, and third sub-gates, the first, second, and third bitlines 145a, 145b, and 145c, and the first to fourth local interconnections 147a, 147b, 147c, and 147d, which are illustrated in FIG. 4D.

First interconnections 260a and 260b may be disposed in the first strapping region 80. The first interconnections 260a and 260b may extend in parallel with each other in the first direction. The first interconnections 260a and 260b may be first string interconnections 260a and first level interconnections 260b. The first interconnections 260a and 260b may be equal to those described with reference to FIGS. 12 and 13. The first level interconnection 260b may be substituted by the level interconnection 260b' illustrated in FIG. 13. The first conductive line 150a may be disposed in the first strapping region 80. The first conductive line 150a may be electrically connected to the common source region and extends in the second direction perpendicular to the first direction.

A second conductive line 150b may be disposed in the second strapping region 80a. The second conductive line 150b may be electrically connected to the well region and extend in parallel with the first conductive line 150a. Second interconnections 262a and 262b may be disposed in the second strapping region 80a. The second interconnections 262a and 262b may be second string interconnections 262a and second level interconnections 262b. Each of the second string interconnections 262a may be electrically connected to the second extension 135bel of the uppermost second sub-gate 135bu and the third extension 135ce of the uppermost third sub-gate 135cu, which are included in included in each of the vertical-type string groups. Each of the second level interconnections 262b may be electrically connected to the extensions 135bel and 135ce of the second and third sub-gates being disposed below the uppermost second and third sub-gates 135bu and 135cu and being located at the same level. Each of the second level interconnections 262b may electrically be connected to a third local interconnection 147c and a fourth local interconnection 147d.

The second interconnections 262a and 262b may be formed of the same material as the first interconnections 260a and 260b and may be disposed at the same level as the first interconnections 260a and 260b. The first interconnections 260a and 260b are spaced apart from the second interconnections 262a and 262b.

Meanwhile, the interconnections 260a and 260b illustrated in FIGS. 12 and 13 may be located at the same level. Alternatively, some of the interconnections may be located at the different level from the others.

Figure 16:
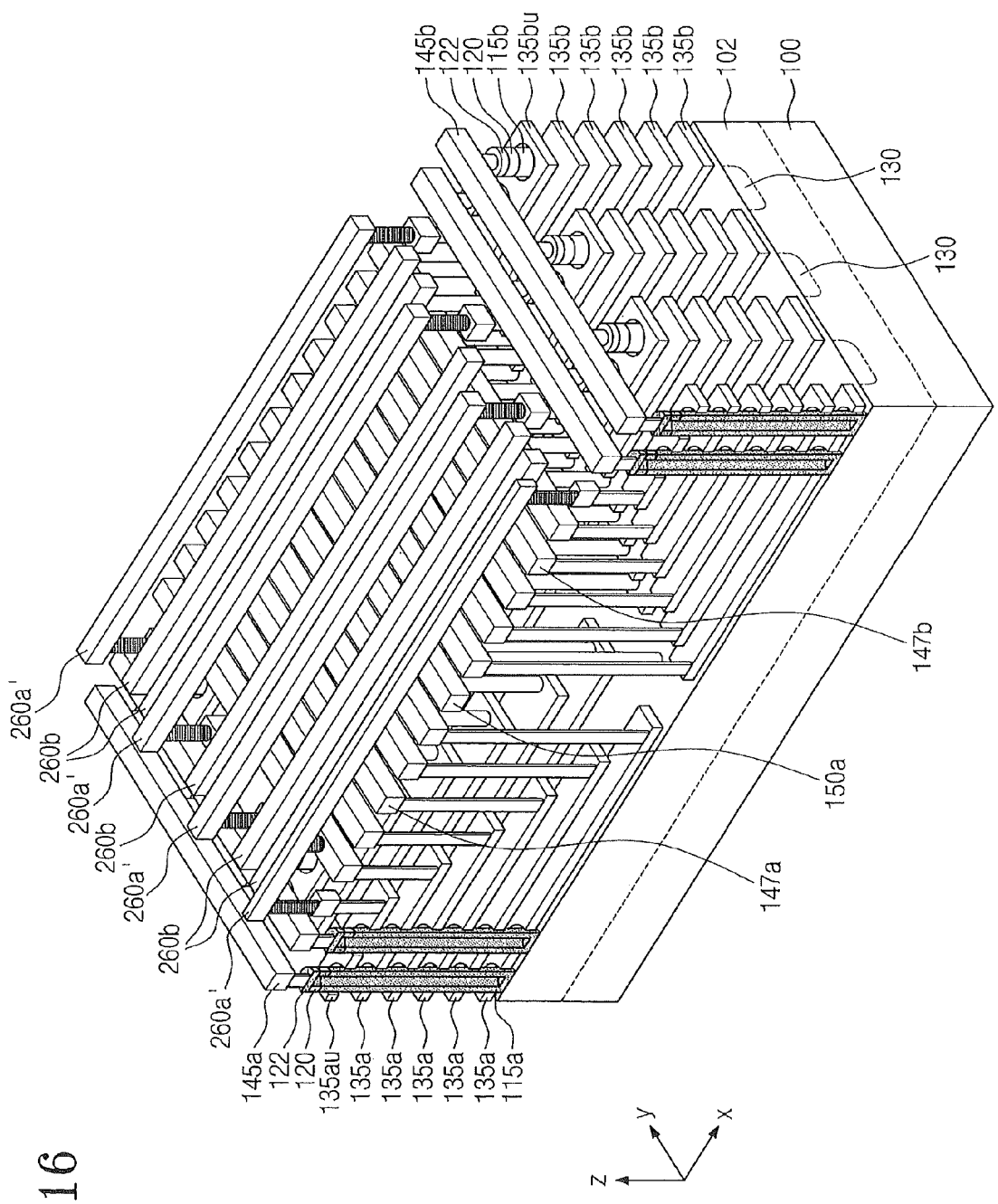
FIG. 16 is a perspective view illustrating still another modified example of the three-dimensional semiconductor memory device according to the second embodiment of the inventive concept.

FIG. 16 is a perspective view illustrating still another modified example of the three-dimensional semiconductor memory device according to the second embodiment of the inventive concept.

Referring to FIG. 16, string interconnections 260a' may be located at the different level from level interconnections 260b. As illustrated in FIG. 16, for instance, the string interconnections 260a' may be located higher than the level interconnections 260b. According to one embodiment of the inventive concept, the level interconnections 260b may be disposed higher than the string interconnections 260a'.

The three-dimensional semiconductor memory device according to the above-described embodiments may be realized in various types of semiconductor packages. For example, the three-dimensional memory device according to the embodiments of the inventive concept may be packaged in a way such as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), thin quad flatpack (TQFP), system in package (SIP), multi chip package (MCP), wafer-level fabricated package (WFP), or wafer-level processed stack package (WSP). A package mounted with the three-dimensional semiconductor memory device according to the embodiments of the inventive concept may further include a controller and/or a logic device, for example, controlling the three-dimensional semiconductor memory device.

Figure 17:
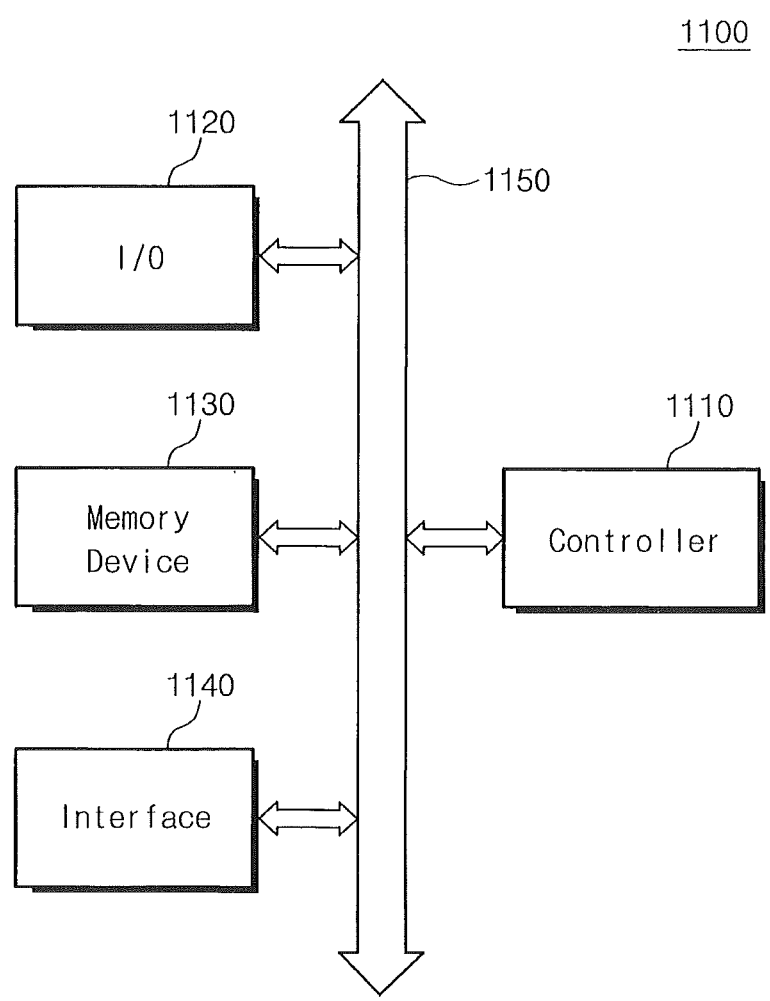
FIG. 17 is a block diagram illustrating schematically one example of an electronic system including the semiconductor memory device according to embodiments of the inventive concept.

FIG. 17 is a block diagram illustrating an electronic system including the semiconductor memory device according to the embodiments of the inventive concept.

Referring to FIG. 17, an electronic system 1100 may include a controller 1110, an input/output device (I/O) 1120, a memory device 1130, an interface 1140, and a bus 1150. The controller 1110, the I/O device 1120, the memory device 1130, and/or the interface 1140 may be connected to each other through the bus 1150. The bus 1150 corresponds to a transfer path of data.

The controller 1110 includes at least one of a microprocessor, a digital signal processor, a microcontroller, and logic devices executing similar functions thereof. The I/O device 1120 may include a key pad, a keyboard, or a display device. The memory device 1130 may store data and/or commands, and the like. The memory device 1130 may include at least one of the three-dimensional semiconductor memory devices disclosed in the above-described embodiments. The memory device 1130 may further include other types of semiconductor memory devices (for example, DRAM device and/or an SRAM device). The interface 1140 executes a function of transmitting data to a communication network or receiving data from a communication network. The interface 1140 may be realized in a wireless or wired form. For example, the interface 1140 may include an antenna or a wireless/wired transceiver. Even though not illustrated, the electronic system 1100 may further include an operational memory device such as a high-speed DRAM and/or a high-speed SRAM for improving the operation of the controller 1110.

The electronic system 1100 is applicable to a personal digital assistant (PDA), a portable computer, a web tablet, a wireless phone, a mobile phone, a digital music player, a memory card, or any electronic apparatus capable of transmitting and/or receiving information in a wireless environment.

Figure 18:
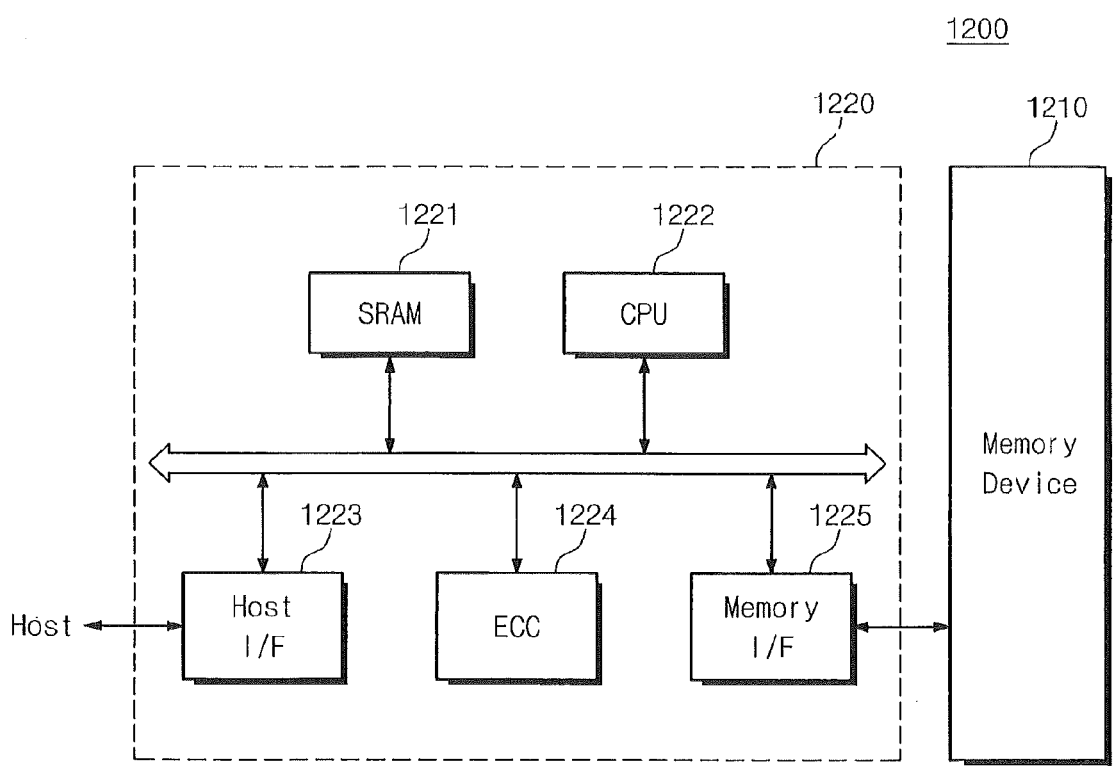
FIG. 18 is a block diagram illustrating schematically one example of a memory card including the semiconductor memory device according to embodiments of the inventive concept.

FIG. 18 is a block diagram illustrating a memory card including the semiconductor memory device according to the embodiments of the inventive concept.

Referring to FIG. 18, a memory card 1200 includes a memory device 1210. The memory device 1210 may include at least one of the three-dimensional semiconductor memory devices disclosed in the above-described embodiments of the inventive concept. The memory device 1210 may further include other types of semiconductor memory devices (for example, DRAM device and/or SRAM device). The memory card 1200 may include a memory controller 1220 controlling data exchange between a host and the memory device 1210.

The memory controller 1220 may include a processing unit 1222 controlling general operations of the memory card. The memory controller 1220 may include an SRAM 1221 used as an operational memory of the processing unit 1222. The memory controller 1220 may further include a host interface 1223 and a memory interface 1225. The host interface 1223 may have a protocol for exchanging data between the memory card 1200 and a host. The memory interface 1225 may connect the memory controller 1220 to the memory device 1210. The memory controller 1220 may further include an error correction coding block (Ecc) 1224. The error correction coding block 1224 may detect and correct an error of data read from the memory device 1210. Even though not illustrated, the memory card 1200 may further include a ROM device storing code data used to interface with a host. The memory card 1200 may be used as a portable data storing card. Alternatively, the memory card 1200 may be realized as a solid state disk (SSD) replacing a hard disk drive of a computer system.

According to the above-described three-dimensional semiconductor memory device, the interconnections are electrically connected to the extensions of the stacked sub-gates disposed in the strapping region. For this reason, the resistance between the sub-gates may be reduced, and the operational voltage may rapidly be supplied to the sub-gates. Consequently, it is possible to realize the three-dimensional semiconductor memory device that is improved in reliability and can operate at high speed.

The above-disclosed subject matter is to be considered illustrative and not restrictive, and the appended claims are intended to cover all such modifications, enhancements, and other embodiments, which fall within the true spirit and scope of the inventive concept is to be determined by the broadest permissible interpretation of the following claims and their equivalents, and shall not be restricted or limited by the foregoing detailed description.

What is claimed is:

1. A method of forming a three-dimensional semiconductor memory device comprising:
preparing a substrate comprising a pair of sub-cell regions and a strapping region between the pair of sub-cell regions;

alternately forming sacrificial layers and dielectric layers on the substrate;

patterning the dielectric layers and the sacrificial layers within the strapping region to form substantially symmetrical terraced structures in the strapping regions;

forming a capping insulating layer covering the terraced structures of the sacrificial layers and dielectric layers;

removing the sacrificial layers having the terraced structures to form empty regions;

forming sub-gates in the empty regions, respectively, the sub-gates including a plurality of sub-gates stacked on the substrate in each of the pair of sub-cell regions, and each of the sub-gates including an extension extending laterally into the strapping region; and forming strapping lines electrically connected to the extensions of the stacked sub-gates, respectively;

wherein each of the strapping lines is electrically connected to the extensions of sub-gates located at the same level and disposed in the pair of sub-cell regions, respectively; and wherein the strapping lines are not electrically connected to a top surface of the substrate in the strapping region.

2. The method of claim 1, wherein removing the sacrificial layers having the terraced structures to form empty regions comprises:

patterning the sacrificial layers, the dielectric layers, and the capping insulating layer to form grooves spaced apart from each other; and removing the patterned sacrificial layers exposed by the grooves.

3. The method of claim 1, further comprising:

forming a data storage layer between the vertical-type channel pattern and each of the sub-gates.

4. The method of claim 1, wherein the strapping lines are formed in the strapping region.

5. The method of claim 1, wherein the strapping lines extend laterally from the strapping region into the pair of sub-cell regions.

6. The method of claim 1, wherein the strapping lines are located at the same level.

7. The method of claim 1, wherein a strapping line electrically connected to an extension of the uppermost sub-gate in the stacked sub-gates is located at a different level from other strapping lines.

8. The method of claim 1, further comprising:

forming a conductive line electrically connected to a part of the top surface of the substrate, wherein the conductive line extends in a direction perpendicular to a longitudinal direction of the strapping line.

9. The method of claim 1, further comprising:

forming a vertical-type channel pattern successively penetrating the dielectric layers and the sacrificial layers within each of the pair of sub-cell regions.

10. The method of claim 9, wherein the vertical-type channel patterns are formed after the substantially symmetrical terraced structures are formed.

11. The method of claim 9, wherein the vertical-type channel patterns are formed before the substantially symmetrical terraced structures are formed.

12. A method of forming a three-dimensional semiconductor memory device comprising:

preparing a substrate comprising a pair of sub-cell regions and a strapping region between the pair of sub-cell regions;

alternately forming sacrificial layers and dielectric layers on the substrate;

patterning the dielectric layers and the sacrificial layers within the strapping region to form substantially symmetrical terraced structures in the strapping regions;

forming a capping insulating layer covering the terraced structures of the sacrificial layers and dielectric layers;

removing the sacrificial layers having the terraced structures to form empty regions;

forming sub-gates in the empty regions, respectively, the sub-gates including a plurality of sub-gates stacked on the substrate in each of the pair of sub-cell regions, and each of the sub-gates including an extension extending laterally into the strapping region; and forming strapping lines electrically connected to the extensions of the stacked sub-gates, respectively, wherein the strapping lines includes at least a first strapping line and a plurality of second strapping lines;

wherein the first strapping line is electrically connected to extensions of uppermost gates located in the pair of sub-cell regions, respectively; and wherein each of the plurality of second strapping lines is electrically connected to extensions of corresponding sub-gates, which are below the extensions of the uppermost gates and are disposed at the same level.

* * * * *